US009692429B1

(12) United States Patent
Chang

(10) Patent No.: US 9,692,429 B1
(45) Date of Patent: Jun. 27, 2017

(54) SYSTEMS AND METHODS INVOLVING FAST-ACQUISITION LOCK FEATURES ASSOCIATED WITH PHASE LOCKED LOOP CIRCUITRY

(71) Applicant: GSI Technology, Inc., Sunnyvale, CA (US)

(72) Inventor: Chao-Hung Chang, Gilroy, CA (US)

(73) Assignee: GSI Technology, Inc., Sunnyvale, CA (US)

( * ) Notice: Subject to any disclaimer, the term of this patent is extended or adjusted under 35 U.S.C. 154(b) by 0 days.

(21) Appl. No.: 14/935,329

(22) Filed: Nov. 6, 2015

Related U.S. Application Data

(63) Continuation of application No. 14/082,097, filed on Nov. 15, 2013, now abandoned.

(60) Provisional application No. 61/727,058, filed on Nov. 15, 2012.

(51) Int. Cl.
*H03L 7/089* (2006.01)

(52) U.S. Cl.
CPC .................. *H03L 7/0891* (2013.01)

(58) Field of Classification Search
CPC ..................................... H03L 7/087
See application file for complete search history.

(56) References Cited

U.S. PATENT DOCUMENTS

| | | |
|---|---|---|
| 4,308,505 A | 12/1981 | Messerschmitt |
| 4,587,496 A | 5/1986 | Wolaver |
| 4,594,564 A | 6/1986 | Yarborough, Jr. |
| 5,302,916 A | 4/1994 | Pritchett |
| 5,744,991 A | 4/1998 | Jefferson et al. |
| 5,969,986 A | 10/1999 | Wong |
| 6,100,721 A * | 8/2000 | Durec .................. G01R 25/00 327/12 |
| 6,262,937 B1 | 7/2001 | Arcoleo et al. |
| 6,407,642 B2 * | 6/2002 | Dosho .................. H03D 13/004 327/156 |
| 6,448,757 B2 | 9/2002 | Hill |
| 6,504,417 B1 | 1/2003 | Cecchi et al. |
| 6,642,747 B1 * | 11/2003 | Chiu .................. H03D 13/004 327/40 |
| 6,683,930 B1 | 1/2004 | Dalmia |
| 6,744,277 B1 | 6/2004 | Chang et al. |
| 6,853,696 B1 | 2/2005 | Moser et al. |
| 6,859,107 B1 | 2/2005 | Moon et al. |
| 6,882,237 B2 | 4/2005 | Singh et al. |
| 6,954,091 B2 | 10/2005 | Wurzer |
| 7,002,404 B2 | 2/2006 | Gaggl et al. |
| 7,042,271 B2 | 5/2006 | Chung et al. |
| 7,095,287 B2 | 8/2006 | Maxim et al. |
| 7,142,477 B1 | 11/2006 | Tran et al. |
| 7,152,009 B2 | 12/2006 | Bokui et al. |
| 7,218,157 B2 * | 5/2007 | Van De Beek ........ H03D 13/00 327/147 |

(Continued)

*Primary Examiner* — Thomas J Hiltunen
(74) *Attorney, Agent, or Firm* — DLA Piper LLP (US)

(57) ABSTRACT

Systems and methods are disclosed relating to fields of clock/data acquisition or handling, such as clock/data locking and the like. In one exemplary implementation, phase lock loop (PLL) circuitry may comprise voltage controlled oscillator (VCO) circuitry, phase frequency detector, converting circuitry, and frequency detector (FD) circuitry that outputs a frequency difference signal proportional to frequency difference between frequencies of a feedback clock signal and a reference clock signal.

23 Claims, 25 Drawing Sheets

(56) References Cited

U.S. PATENT DOCUMENTS

| | | |
|---|---|---|
| 7,282,999 B2 | 10/2007 | Da Dalt et al. |
| 7,349,515 B1 | 3/2008 | Chew et al. |
| 7,369,000 B2 * | 5/2008 | Wu .................. H03L 7/087 331/1 A |
| 7,439,816 B1 * | 10/2008 | Lombaard ............ H03L 7/07 331/11 |
| 7,545,223 B2 | 6/2009 | Watanabe |
| 7,577,225 B2 | 8/2009 | Azadet et al. |
| 7,592,847 B2 * | 9/2009 | Liu .................. H03D 13/004 327/12 |
| 7,622,996 B2 | 11/2009 | Liu |
| 7,633,322 B1 | 12/2009 | Zhuang et al. |
| 7,728,675 B1 * | 6/2010 | Kennedy ............ H03L 7/087 327/157 |
| 7,737,743 B1 * | 6/2010 | Gao .................. H03L 7/087 327/156 |
| 7,812,644 B2 | 10/2010 | Cha et al. |
| 7,830,212 B2 * | 11/2010 | Lee .................. H03L 7/085 331/107 SL |
| 7,843,239 B2 | 11/2010 | Sohn et al. |
| 7,848,725 B2 | 12/2010 | Zolfaghari et al. |
| 7,920,665 B1 | 4/2011 | Lombaard |
| 7,940,088 B1 | 5/2011 | Sampath et al. |
| 7,944,256 B2 | 5/2011 | Masuda |
| 7,965,108 B2 | 6/2011 | Liu et al. |
| 8,044,724 B2 | 10/2011 | Rao et al. |
| 8,063,707 B2 | 11/2011 | Wang |
| 8,242,820 B2 | 8/2012 | Kim |
| 8,692,621 B2 * | 4/2014 | Snowdon ............ H03L 7/089 327/156 |
| 9,053,768 B2 | 6/2015 | Shu et al. |
| 2004/0169565 A1 | 9/2004 | Gaggl et al. |
| 2005/0024912 A1 | 2/2005 | Chen et al. |
| 2005/0186930 A1 | 8/2005 | Rofougaran et al. |
| 2006/0139105 A1 | 6/2006 | Maxim et al. |
| 2007/0109030 A1 * | 5/2007 | Park .................. H03L 7/087 327/156 |
| 2007/0229129 A1 | 10/2007 | Nakagawa |
| 2008/0068096 A1 | 3/2008 | Feng et al. |
| 2009/0256642 A1 * | 10/2009 | Lesso .................. H03L 7/08 331/1 A |
| 2010/0085086 A1 | 4/2010 | Nedovic et al. |
| 2011/0018597 A1 | 1/2011 | Lee et al. |
| 2012/0153999 A1 | 6/2012 | Kim |

\* cited by examiner

SYSTEMS AND METHODS INVOLVING FAST-ACQUISITION LOCK FEATURES ASSOCIATED WITH PHASE LOCKED LOOP CIRCUITRY

This is a continuation of application Ser. No. 14/082,097, filed Nov. 15, 2013, which claims the benefit/priority of provisional application No. 61/727,058, filed Nov. 15, 2012, all of which are hereby incorporated by reference in entirety.

BACKGROUND

Field

Aspects of the innovations herein relate generally to fields of clock/data acquisition or handling, such as features involved with clock locking, data locking, clock synthesis, clock data recovery, feedback clocking, and acquiring a quick lock in phase lock loop (PLL) circuitry.

Description of Related Information

Various circuits and techniques are used to achieve lock in phase lock loop circuitry. For example, FIGS. 1-3 depicts existing circuitry and background in this regard, with FIG. 1A depicting an existing phase frequency detector and FIG. 3 depicting an existing phase lock loop (PLL) circuit. In the PLL configuration shown in FIG. 3, the phase frequency detector (PFD) 310 pulls in the frequency and locks in the phase. However, for a wide-range frequency synthesizer, various PLL acquisition techniques such as here in FIGS. 1-3 can be unsatisfactory. Among other things, such techniques can be too slow if the preset frequency and target frequency are quite different. Negative gain and cycle slipping issues can also arise. When a phase frequency detector (PFD) reaches its limit, for example, one of the clock edges is ignored. This can lead to cycle slipping, which should occur when a second clock edge catches up before the previous clock edge comparison finishes. Further, cycle slipping can occur too early in prior circuitry. For example, cycle slipping may occur as soon as the second clock edge is blocked by the rear edge of the "up", "down" signals, which can happen too early and even generate a negative gain.

In addition, existing approaches to frequency detection, such as rotational frequency detectors and quadricorrelators, often have limited detection ranges and/or also have a variety of other drawbacks. Rotational frequency detection, for example, typical requires numerous clocks/signals such as internal quadrature clocks (90 degree offset clocks), an I clock (I-clk 902), and a Q clock (Q-clk 904) as well as latching and comparison of the various states thereof. Further, other approaches such as quadricorrelators also involve quadrature clocks, may operate as a function of DC components, and are also an analog solution, thus present associated challenges to adapt to digital circuitry.

Overall, there is a need for systems and methods that may, inter alia, possess improved frequency difference detection, involve fewer clock signals, be digital solutions, more quickly adjust the frequency of a feedback clock, and/or otherwise achieve lock-in condition more quickly with respect to various circuitry.

BRIEF DESCRIPTION OF THE FIGURES

For a better understanding of the implementations described in this application, reference should be made to the Detailed Description below, in conjunction with the following drawings in which like reference numerals refer to corresponding parts throughout the Figures.

FIGS. 9A-1 through 9A-3 show an illustrative circuit schematic of exemplary frequency detector circuitry consistent with aspects of the innovations herein.

FIGS. 10A-1 through 10A-3 show another illustrative circuit schematic of exemplary frequency detector circuitry consistent with aspects of the innovations herein.

FIGS. 12A-1 through 12C-2 show illustrative circuitry of exemplary charge pump circuits consistent with aspects of the innovations herein.

DETAILED DESCRIPTION OF ILLUSTRATIVE IMPLEMENTATIONS

Reference will now be made in detail to implementations of the innovations herein, examples of which are illustrated in the accompanying drawings. In the following detailed description, numerous specific details are set forth in order to provide a sufficient understanding of the subject matter presented herein. But it will be apparent to one of ordinary skill in the art that the subject matter may be practiced without these specific details. Moreover, the particular embodiments described herein are provided by way of example and should not be used to limit the scope of the invention to these particular embodiments. In other instances, well-known data structures, timing protocols, software operations, procedures, and components have not been described in detail so as not to unnecessarily obscure aspects of the embodiments of the present inventions.

Figure 1A:
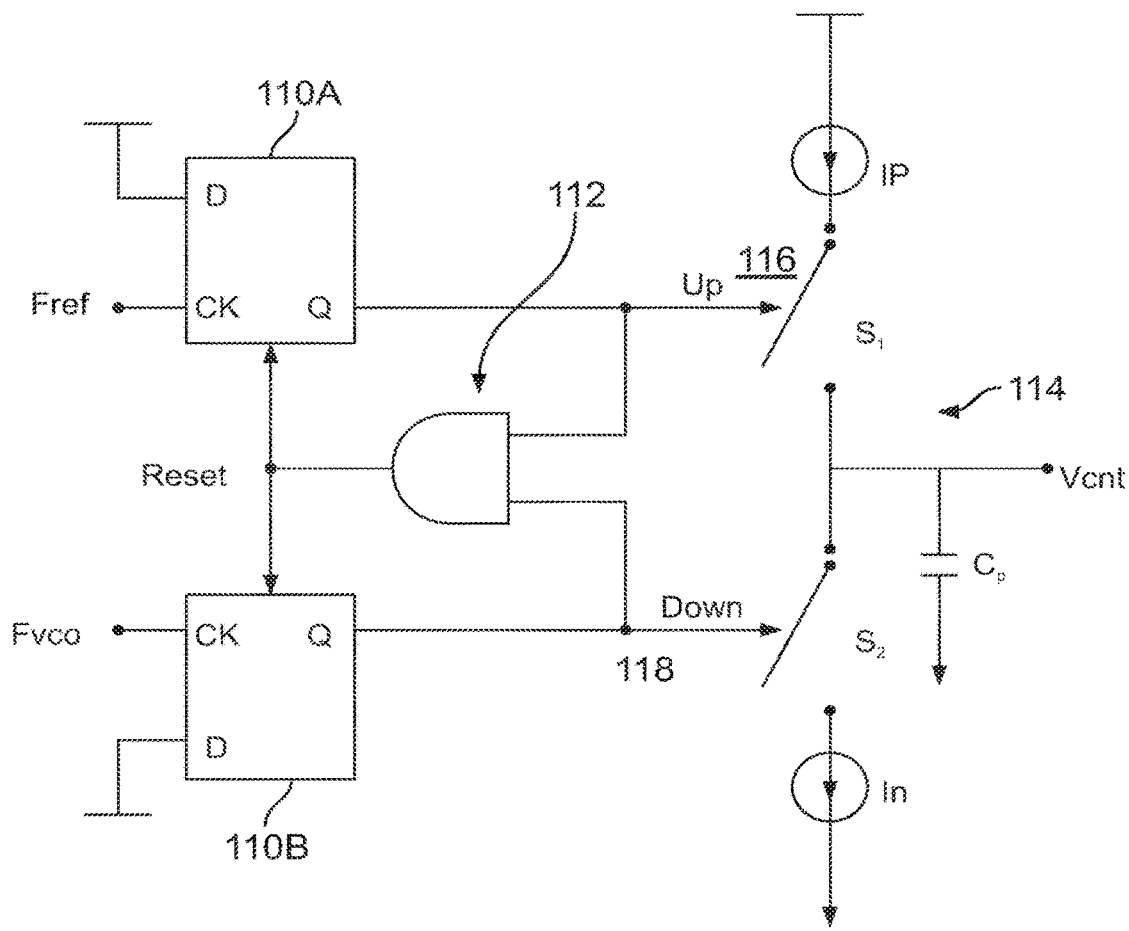
FIG. 1A illustrates a conventional phase frequency detector.

FIG. 1A shows a conventional phase frequency detector. Referring to FIG. 1A, a conventional PFD may comprise two D flip-flops 110A, 110B, an AND gate 112, and an output 114. Here, at the first D flip-flop 110A, the rising edge of reference clock $F_{ref}$ sets output Q to logic "1". When "Reset" is logic "1", output Q is reset to logic "0". The second flip-flop 110B is the same circuit but responses to feedback clock. Further, a "reset" signal is generated by 'logic AND' operation (112) of "up" 116 and "dn" 118 signals. The "up", "dn" signals are sent via output 114 to charge pump circuit to charge (when "up"=logic "1") or discharge (when "dn"=logic "0" [when "dn" is active/asserted]) capacitor Cp. So the total charge delivered to the capacitor Cp in a cycle is proportional to the width difference of "up", "dn" signals.

The delay time of the loop from each D-flip-flop 110A, 110B and the AND element 112 then back to D-flip-flop has to be long enough to avoid dead zone entailed by the time to full turns on switches (S1, S2) in charge pump. But this also means "Reset" has certain pulse width requirements. When either clock edges falls into "Reset"=logic 1, the clock is blocked in D-flip-flop operation. Such contention may cause, inter alia, the negative gain issue explained above.

Figure 1B:
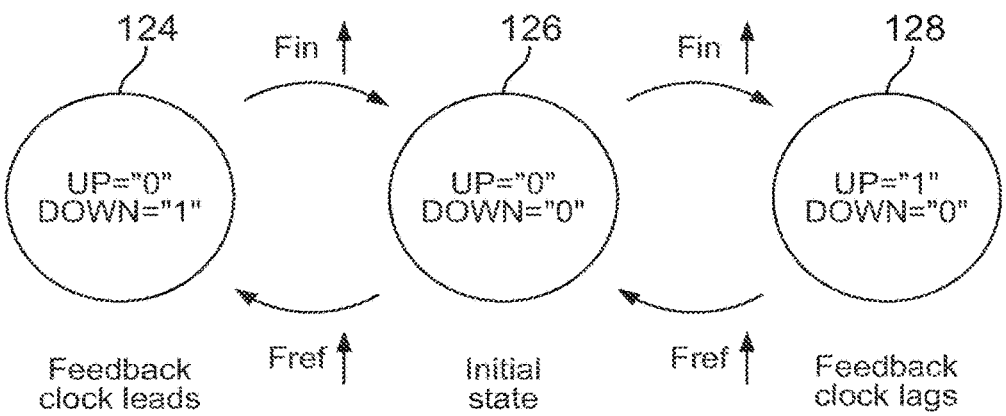
FIG. 1B depicts an illustrative state diagram showing feedback clock lead and lags.

FIG. 1B depicts an illustrative state diagram showing feedback clock lead and lags. Here, for example, after reset by "Reset"=logic "1", a PFD may be in state "up=0, dn=0" (126), represented by Q output of the two D-flip-flops. Depending on which clock rising edge comes first, the PFD then enters different states. If feedback clock leads, it enters "up=0, dn=1" state 124. If feedback clock lags, it enters "up=1, dn=0" state 128.

Figure 2A:
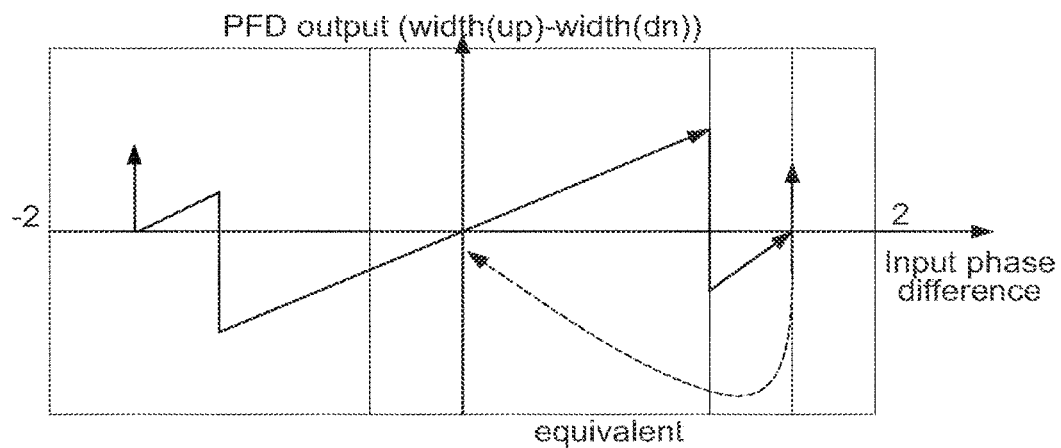
FIGS. 2A-2B illustrate how a phase frequency detector affects/pulls clock frequency.
Figure 2B:
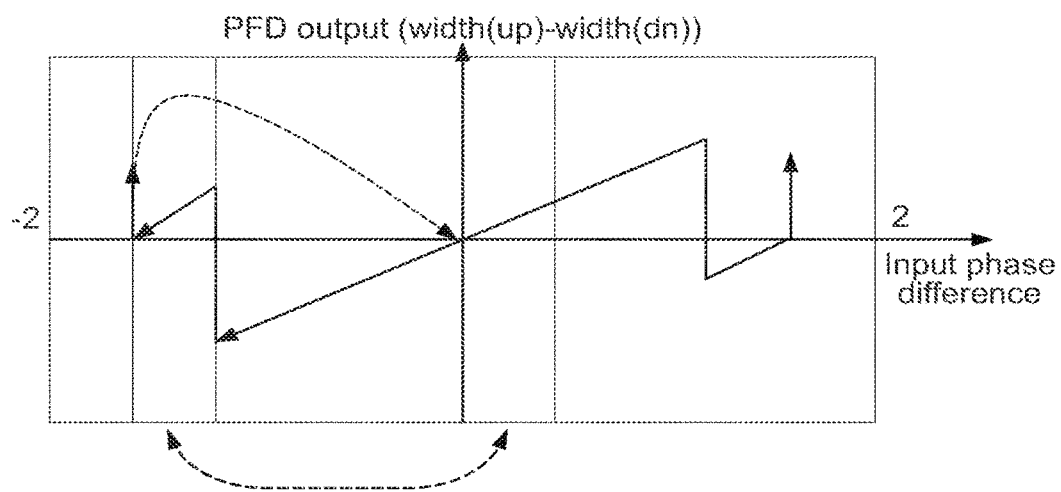

FIGS. 2A-2B illustrate how a phase frequency detector may affect/pull clock frequency. Referring to the implementation of FIG. 2 and assuming clock frequency changes slowly, PFD output takes one of the routes in either FIG. 2A or 2B. The pull-in current is the average of the PFD output along either route. As such, the pull-in current is small. Further, this current can't change independently to accommodate pull-in process as it affects the lock-in condition.

Figure 3:
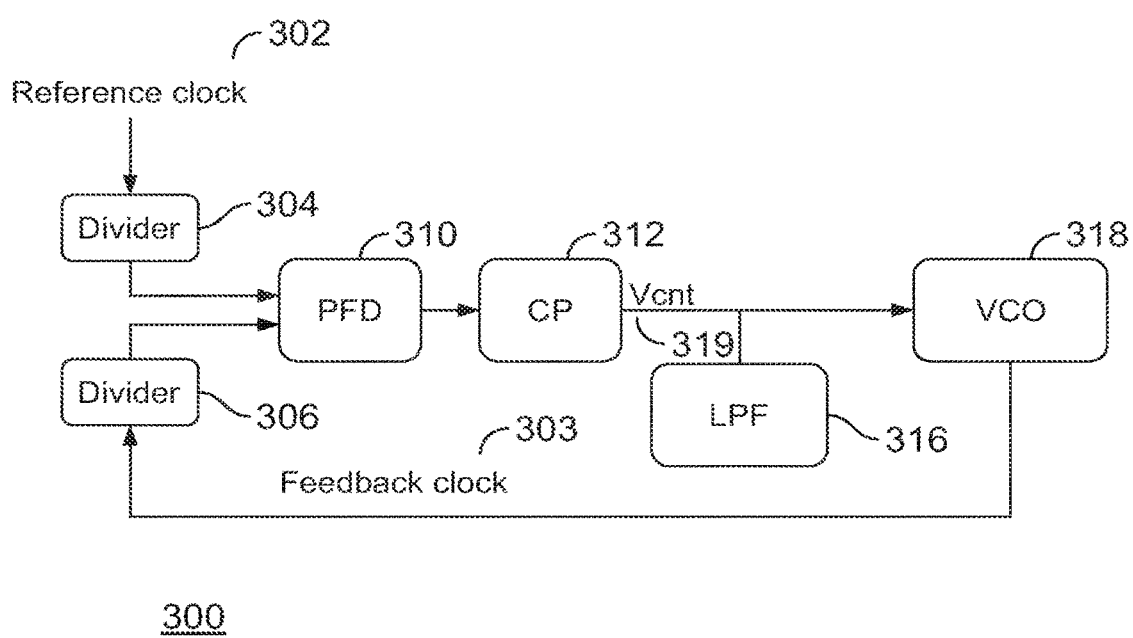
FIG. 3 illustrates an existing Phase Lock Loop Circuit.

FIG. 3 illustrates an existing Phase Lock Loop Circuit with frequency dividers 304, 306, a phase frequency detector 310, a charge pump 312, a low pass filter 316 and a voltage controlled oscillator (VCO) 318. Here, for example, both the reference clock 302 and the feedback clock 303 are divided by the frequency dividers 304, 306. The division ratio can be different. Then the divided clocks are sent to the PFD 310 for phase comparison. Charge pump 312 may then adjust "Vcnt" 319 by a charge proportional to the PFD outputs. Low pass filter 316 filters out high frequency components and tunes up loop characteristics. VCO generates a feedback clock 303 at frequency adjusted by "Vcnt" 319.

Figure 4:
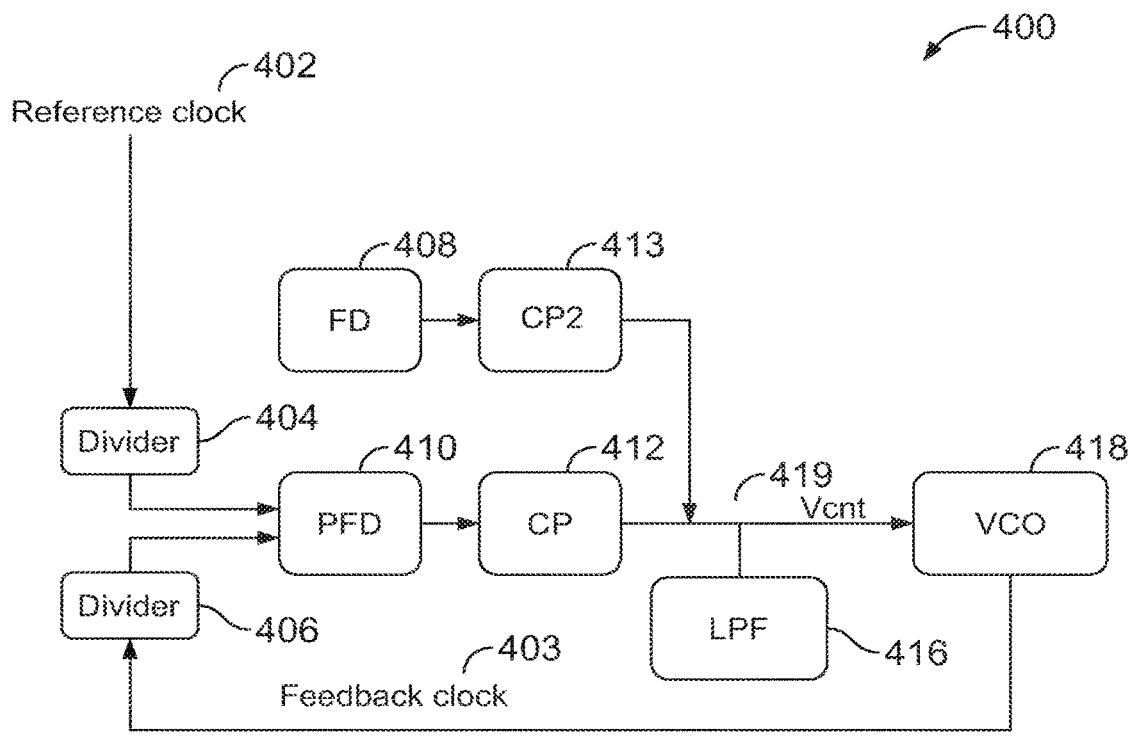
FIG. 4 depicts an illustrative Digital Frequency Detector aided fast acquisition Phase Locked Loop consistent with aspects related to the innovations herein.

FIG. 4 depicts illustrative Frequency Detector aided fast acquisition Phase Locked Loop (PLL) circuitry 400 consistent with aspects related to the innovations herein. Referring to FIG. 4, PLL circuitry 400 may comprise voltage controlled oscillator (VCO) circuitry 418 that generates a feedback clock signal, phase frequency detector (PFD) circuitry 410 that receives the feedback clock signal and a reference clock signal, compares a phase of the feedback clock signal to a phase of the reference clock signal, and outputs a phase comparison signal, first charge pump circuitry 412 configured to receive the phase comparison signal and output a control signal proportional to the phase comparison signal to the VCO circuit, frequency detector (FD) circuitry 408 that receives the feedback clock signal and the reference clock signal, and second charge pump circuitry 413 that receives the frequency difference signal and output a control signal proportional to the frequency difference signal to the VCO circuit. Frequency detector circuitry 408 that receives the feedback clock signal and the reference clock signal, may be further adapted to compare a frequency of the feedback clock signal to a frequency of the reference clock signal, and output a frequency difference signal that is proportional to a frequency difference between the frequency of the feedback clock and the frequency of the reference clock signal determined by the comparing of the frequencies.

Here, frequency detector circuitry 408 compares frequency difference of reference clock and feedback clock, with its output being proportional to the frequency difference. As such, the second charge pump circuitry 413 charges or discharges "Vcnt" 419 in proportional to the FD circuit 408 output. Moreover, as touched on above, the pull-in current of PFD 410 is small. And PFD affects lock-in condition, so it can't be adjusted freely and independently, e.g., to increase pull-in current.

According to implementations herein, the PLL circuitry may utilize frequency detector circuitry 408 such as a digital frequency detector, as set forth in the present disclosure to increase acquisition speed. Here, for example, such frequency detector circuitry 408 may turn "on" when the frequency of reference clock and feedback clock are very different. When the frequency of reference clock and feedback clock are close enough, FD turns off and allows the PFD loop continues to lock the phase precisely.

Overall, via benefits of the frequency detection features and associated circuitry herein, PLL systems and methods herein may detect frequency difference and quickly adjust the frequency of feedback clock. As a function of implementations and innovations involving circuitry herein, such as frequency detector circuitry 408, a PLL can achieve lock-in condition faster.

Figure 5A:
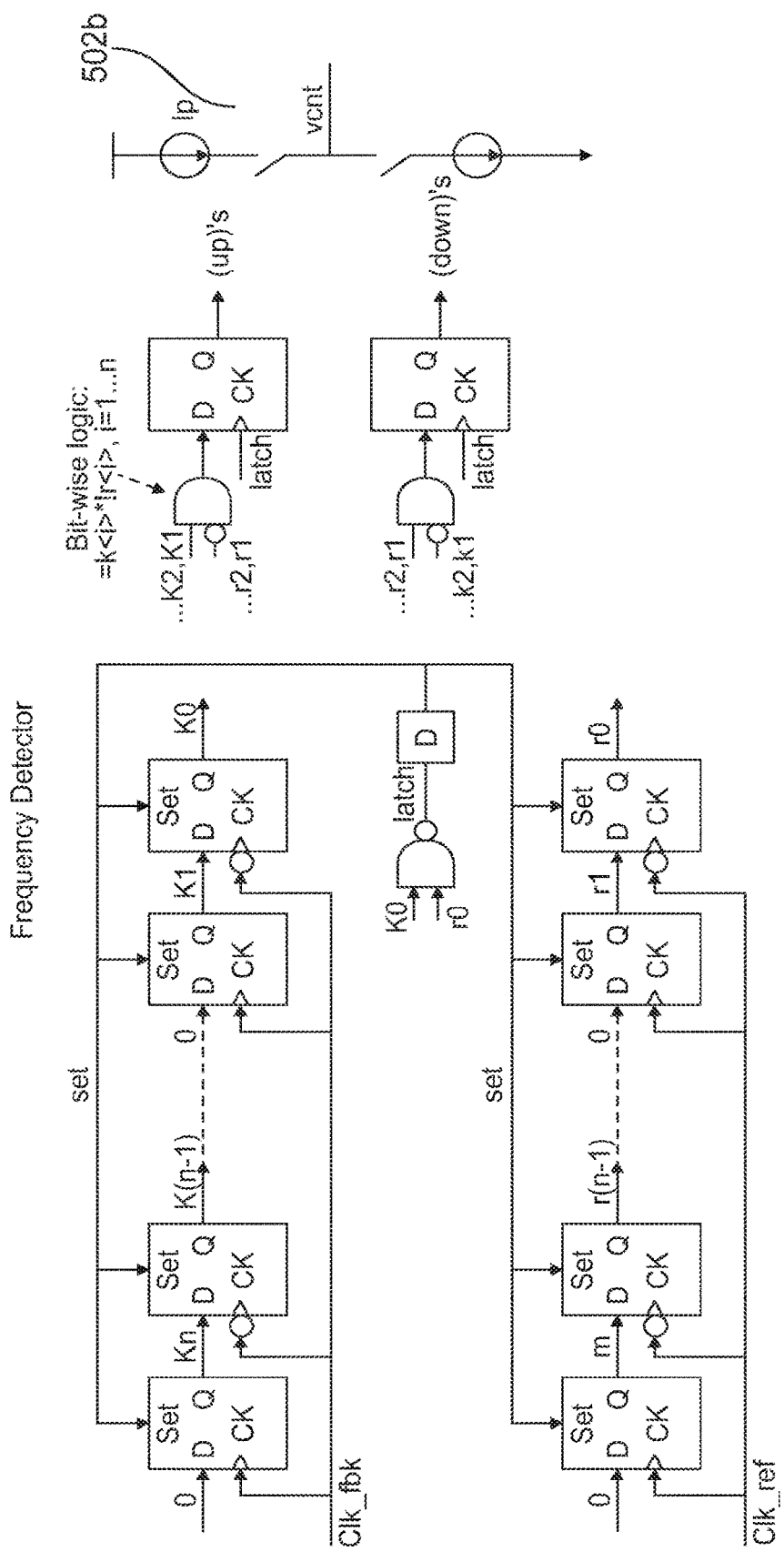
FIGS. 5A through 5C show illustrative Frequency Detector Implementations consistent with one or more aspects of the innovations herein.

FIG. 5A shows an illustrative frequency detector circuitry implementation consistent with one or more aspects of the innovations herein. Referring to FIG. 5A, the first part of the illustrative FD circuit 408 shown includes two (n+1)-bit shift register chains 502A, 504A clocked by reference clock and feedback clock, respectively. This part of the circuitry may be configured for operation via a sequence of steps such as: (1) initialize, to state "1", the two shift register chains 502A, 504A; (2) shift-in state "0" information via reference clock and feedback clock respectively; and (3) generate, by a "NAND" gate 510A, a set signal once the last stage output at one of the shift register chain is logic "0". As such, with little delay, the two shift register chains may be reset to state "1" and may restart the process.

A second part 514A of the frequency detector circuitry 408 may include a bit-wise logic operation and a register to latch the result of the logic operation. Here, for example, just before shift register chains are reset in step 3, above, states of shift register chains may be latched via a bit-wise logic operation ($k<i>$ 'logic and' $!r<i>$).

A third part of circuit 520A may include a switchable current source and current sink controlled by the bit-wise outputs from the second part of circuit. All the current sources or the current sinks are connected to node "Vcnt" for adjusting control voltage for VCO output frequency (feedback clock frequency).

Figure 5B:
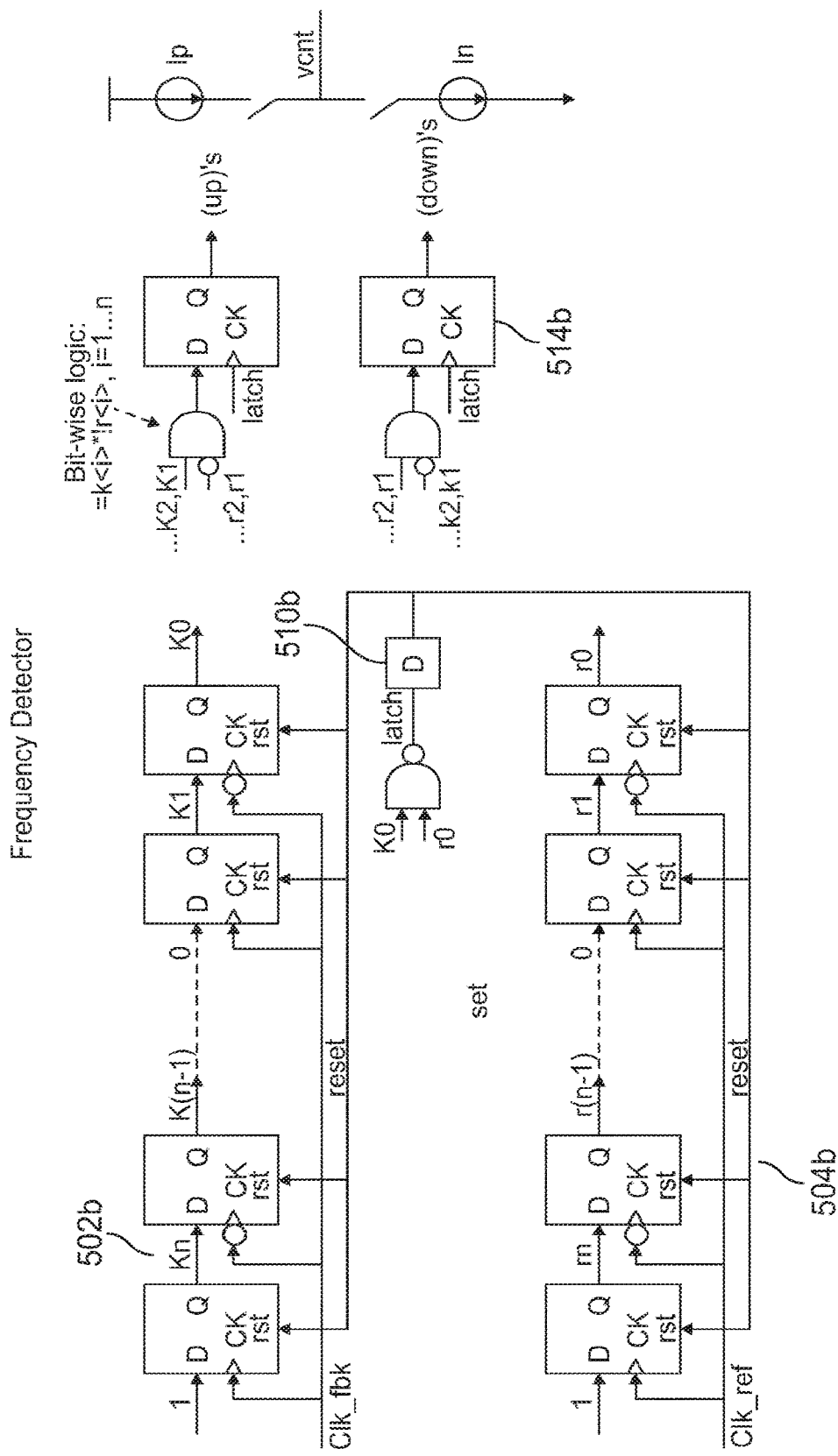
Figure 5C:
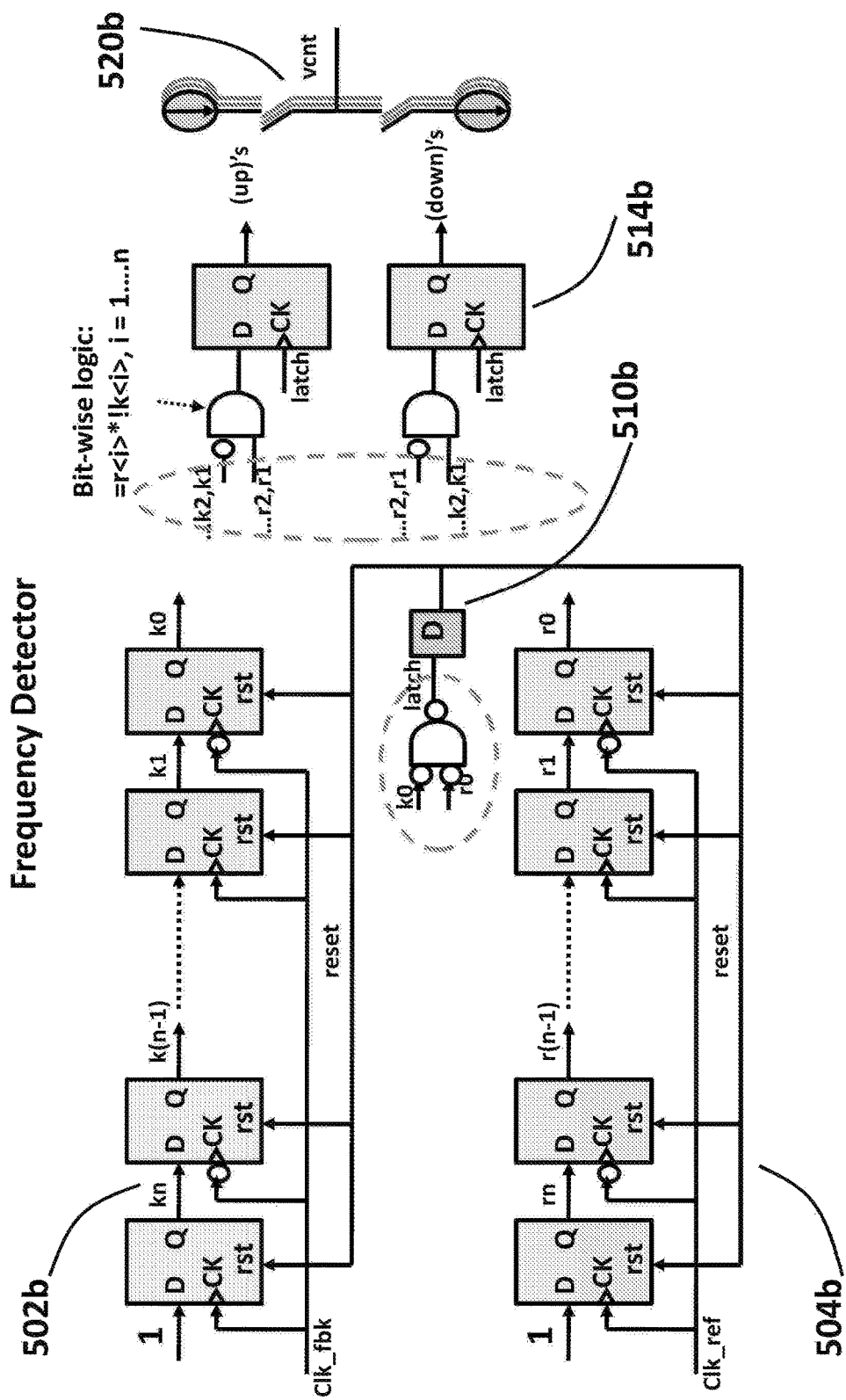

FIGS. 5B and 5C show other illustrative frequency detector circuitry implementations consistent with one or more aspects of the innovations herein. The circuit of FIG. 5B may be similar in circuitry and operation to that of FIG. 5A, including shift register chains 502B, 504B, as well as comparable second and third parts 514B, 520B. However, in FIG. 5B, the polarity of the logic circuit is reversed. Therefore, the shift register chains are initialized to state "0", and a state "1" shifts in with the reference clock and feedback clock. The gate 510B may generate a set signal once the last stage output at one of the shift register chains reaches logic "1". Thereafter, the two shift register chains may be reset to state "0", and the process may be restarted.

Figure 6:
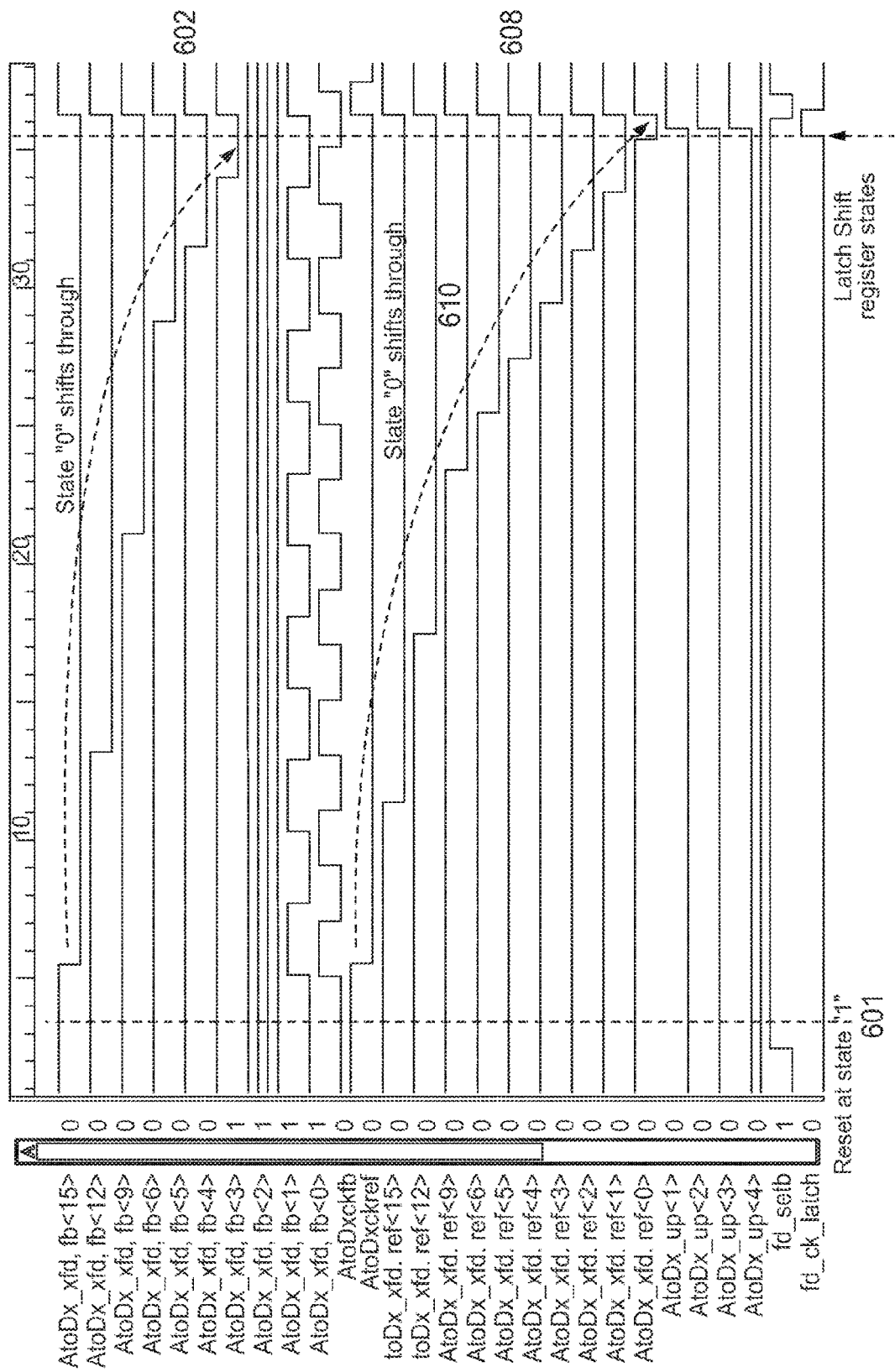
FIG. 6 depicts an illustrative Time-Domain Waveform of an exemplary Frequency Detector according to the implementation of FIG. 5A consistent with one or more aspects of the innovations herein.

FIG. 6 depicts an illustrative time-domain waveform of an exemplary frequency detector consistent with one or more aspects of the innovations herein. Referring to FIG. 6, all register outputs of the shift register chains (e.g., 502A, 504A, FIGS. 5A and 5B) are at logic "1" initially (at point 601). Then logic "0" is passed through the register chains. When last stage output of feedback clock chain 610 becomes logic "0" at point 612, all outputs in this chain 608 are logic "0". Here, as only part of outputs in reference clock chain 602 is logic "0", the difference in number of logic "0" implies the difference of frequency. The difference in number of logic "0" also decides the charging or discharging current associated with the second charge pump circuitry. The larger difference, for example, may charge or discharge greater current on "Vcnt" node.

Figure 7:
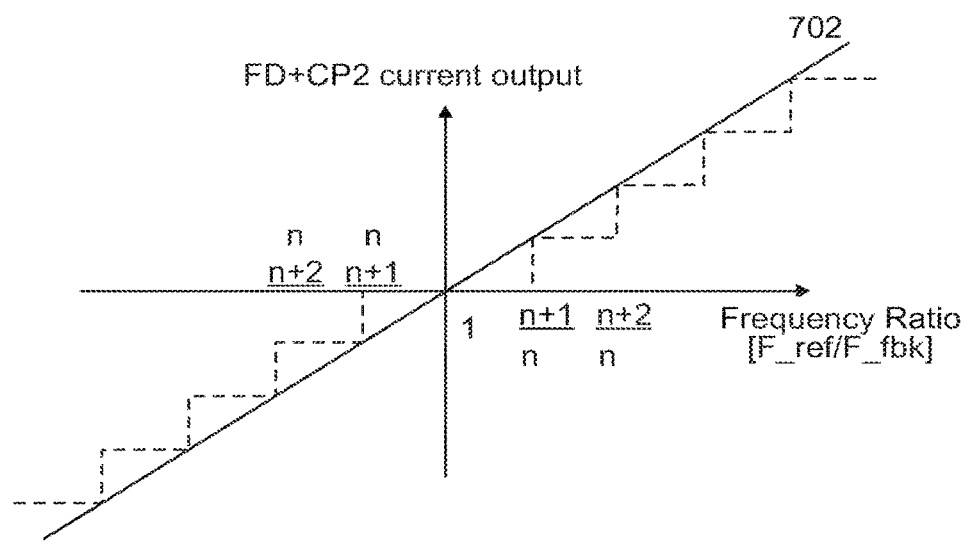
FIG. 7 shows an illustrative FD+CP2 current output consistent with one or more aspects of the innovations herein.

FIG. 7 shows an illustrative frequency detector and second charge pump current output consistent with one or more aspects of the innovations herein. Referring to FIG. 7, the x-axis is the frequency ratio of reference clock and feedback clock. As such, the more that the two frequency differ from each other, the larger the frequency ratio and it generates more FD+CP2 current output. The illustrated line 702 is an approximation curve of the transfer curve. Accordingly, a larger frequency ratio will yield a larger current output of the frequency detector and second charge pump circuitry.

In exemplary implementations consistent with FIG. 7, two (n+1)-bit shift register chains may be clocked by reference clock and feedback clock respectively. Exemplary steps may include: initializing the two shift register chains to state "1", and shifting-in state "0" via the clocks. When a state "0" is shifted to the end of either shift register chain, the states of the two chains may then be compared and latched to estimate the frequency ratio of reference clock and feedback clock. With a little delay, the two shift register chains may then be reset to state "1", to restart the process.

Figure 8:
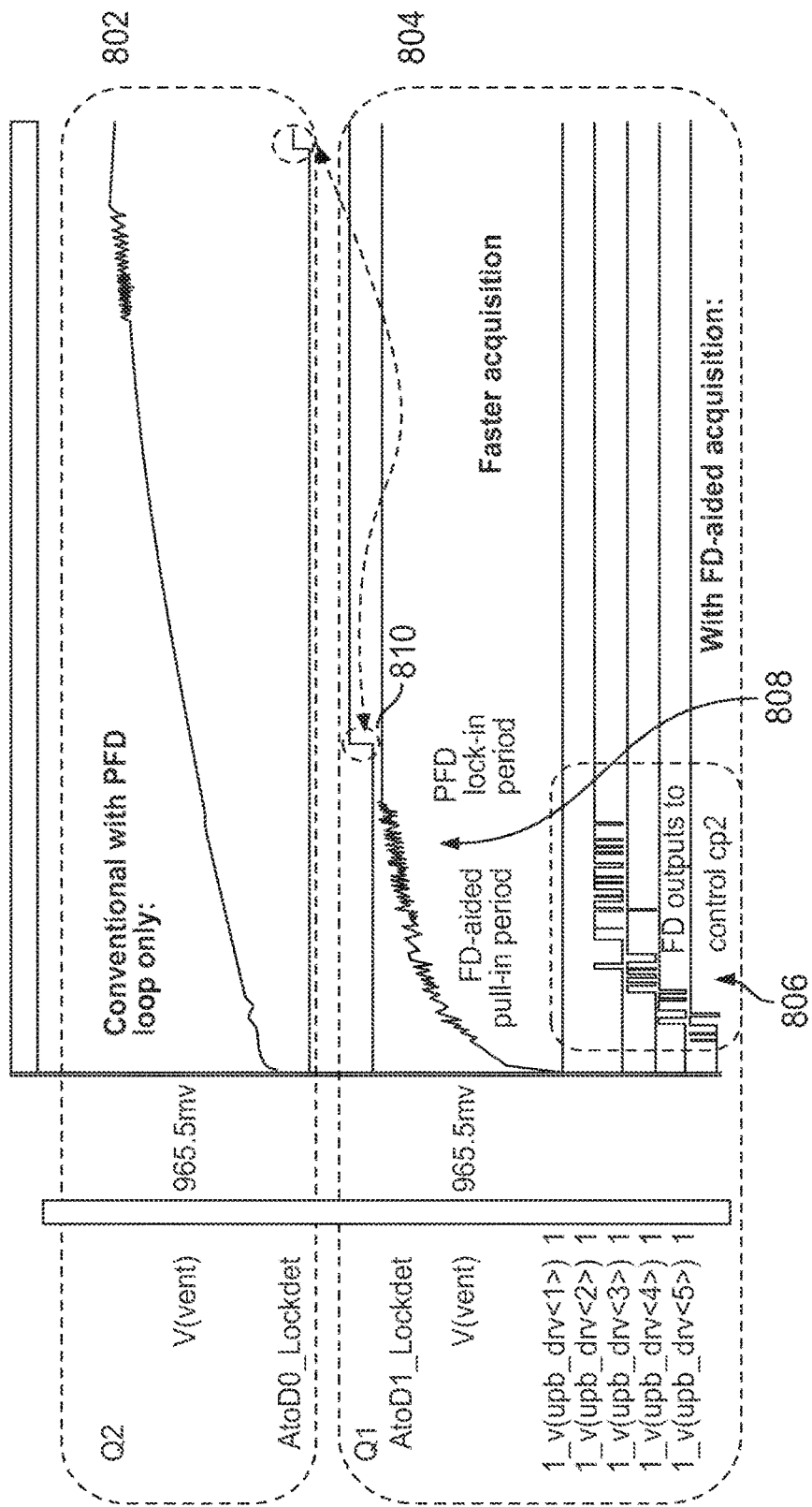
FIG. 8 shows an illustrative Time-Domain Waveform of a Closed-Loop Phase Locked Loop simulation, contrasted with a comparative PFD-only loop system, consistent with aspects of the innovations herein.

FIG. 8 shows an illustrative time-domain waveform of a closed-loop phase lock loop representation. A shown in FIG. 8, via frequency detection-aided acquisition circuitry, the PLL circuitry is locked much faster, at 810. Consistent with the innovations herein, the frequency detector and second charge pump circuitry generate larger current at larger frequency differentials to decrease the pull-in period, at 808, while the conventional phase frequency detector and charge pump circuitry merely generates almost constant pull-in current and has associated curve 802.

Figures 1, 9A:
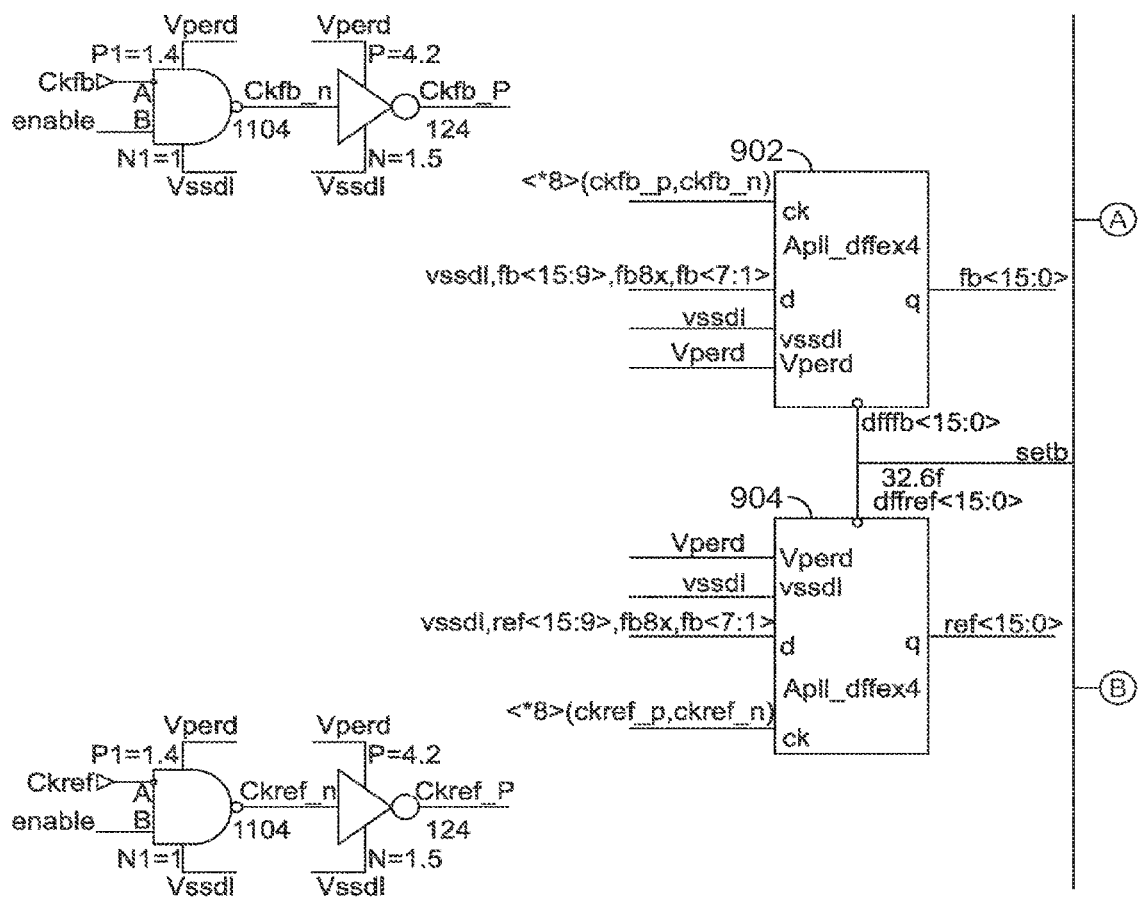
Figures 2, 9A:
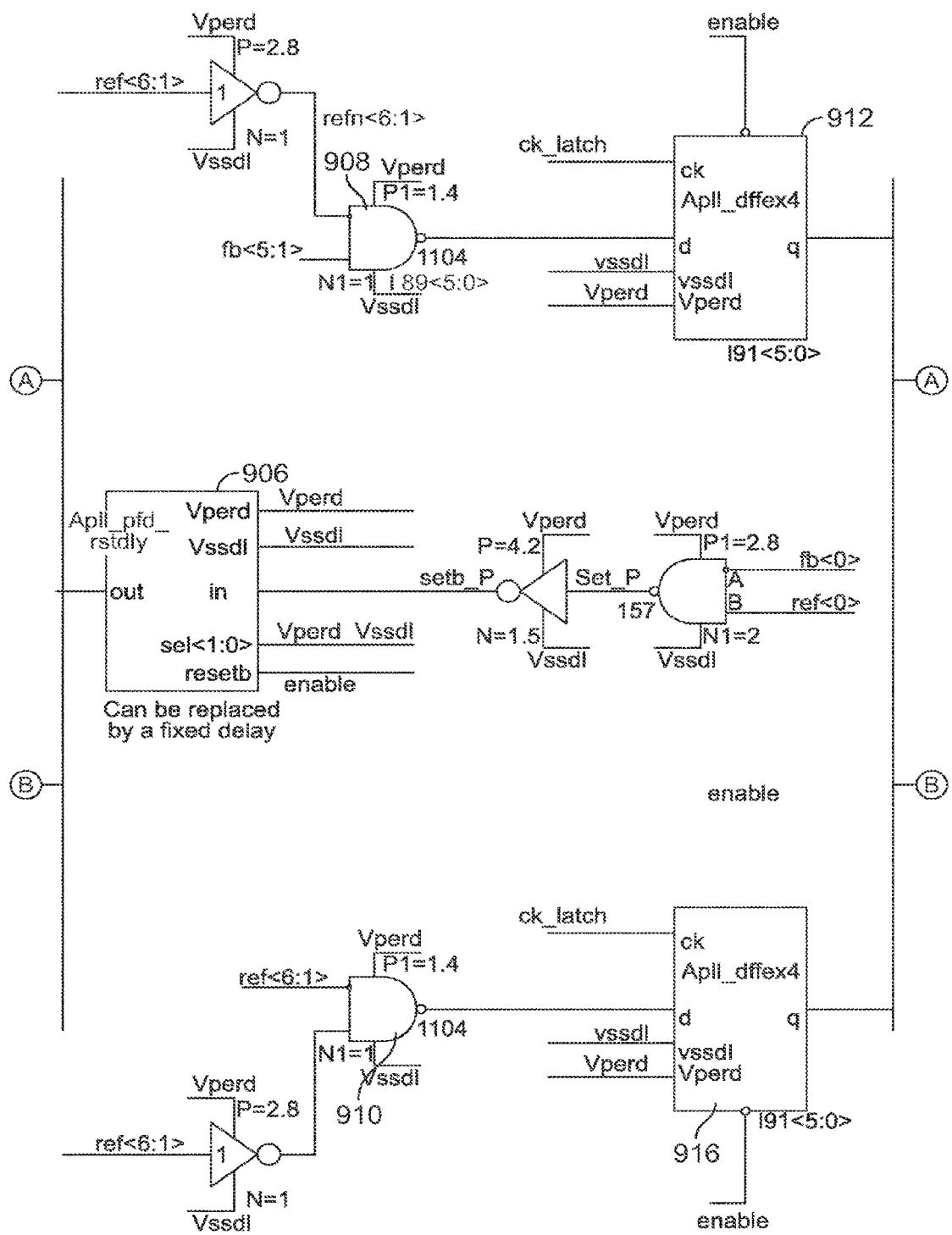
Figures 3, 9A:
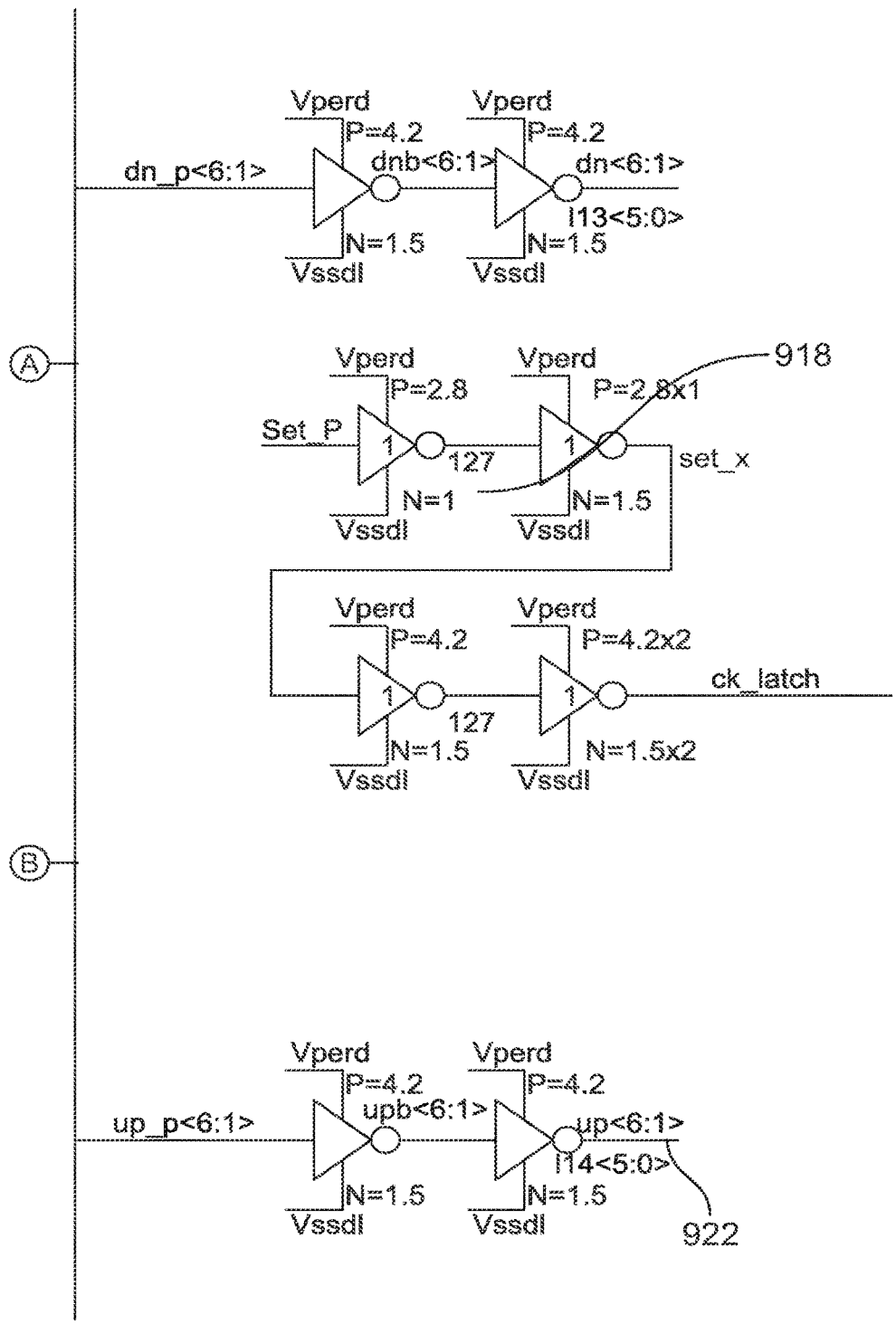

FIGS. 9A-1 through 9A-3 show illustrative circuitry of exemplary frequency detector circuitry consistent with aspects of the innovations herein. Referring to FIG. 9A-1, elements 902 and 904 are the shifter register chains for the feedback clock and reference clock, respectively. The output Setb of the delay circuit 906 is then provided to an input of the shift register chain 902 and 904 shown in FIG. 9A-2 that can be replaced by a fixed delay. Element 906 is the delay circuit for a "set" signal. In FIG. 9A-2, elements 908 and 910 are the bit-wise logic to compare the states of the two register chains. The outputs of elements 908 and 910 are input to elements 912 and 916, respectively, to latch the compared states. The output of element 906 is input to element 914. Element 914 is the logic for generating "latch" and "set" signals where the output of element 906 is input to element 914. In FIG. 9A-3, the output of elements 912 and 916 control elements 920 and 922, respectively, where elements 920 and 922 are the "up", "dn" signals for controlling the charge pump circuit. Finally, elements 918 are buffers for "latch" signal.

Figures 1, 10A:
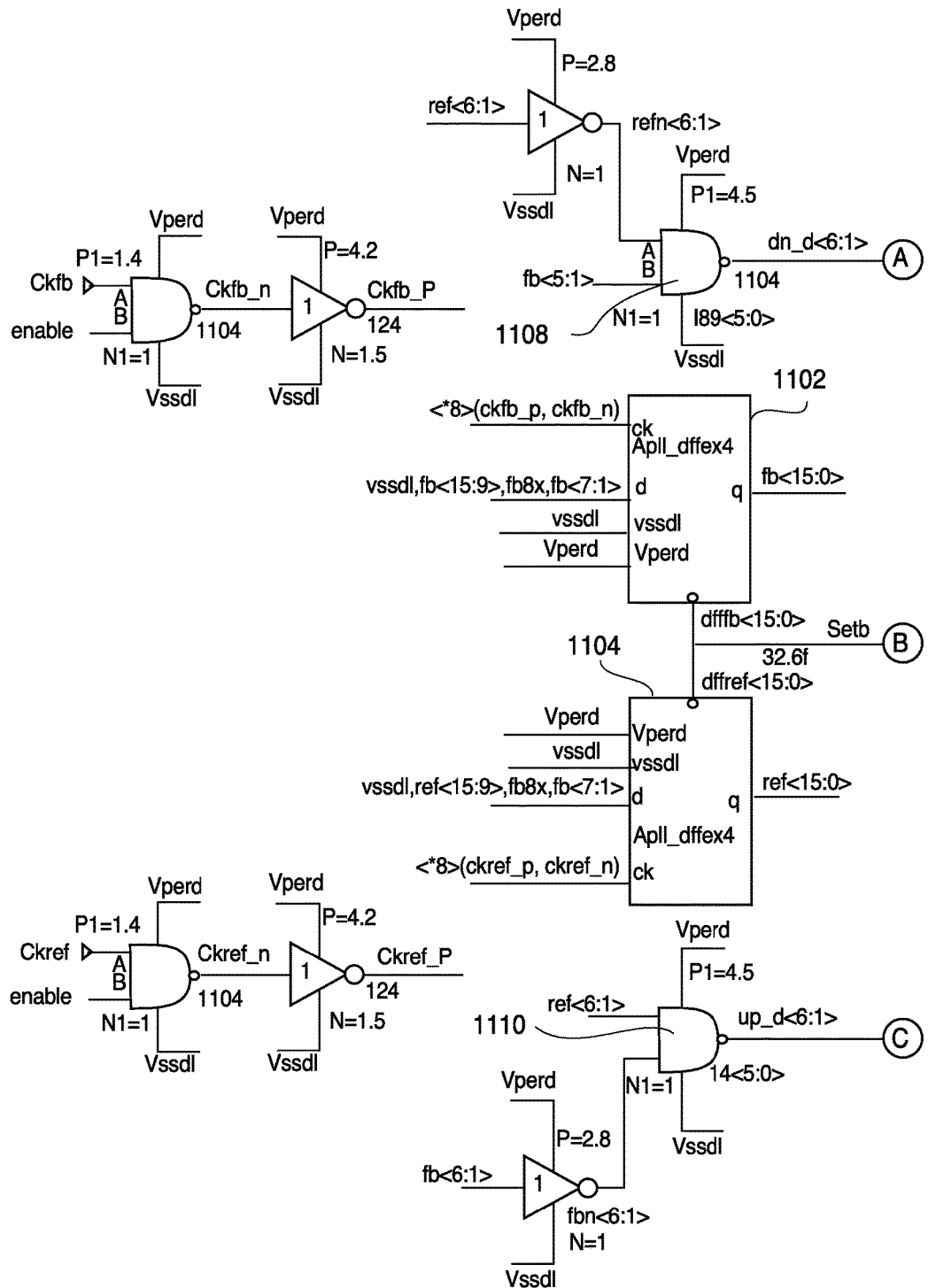
Figures 2, 10A:
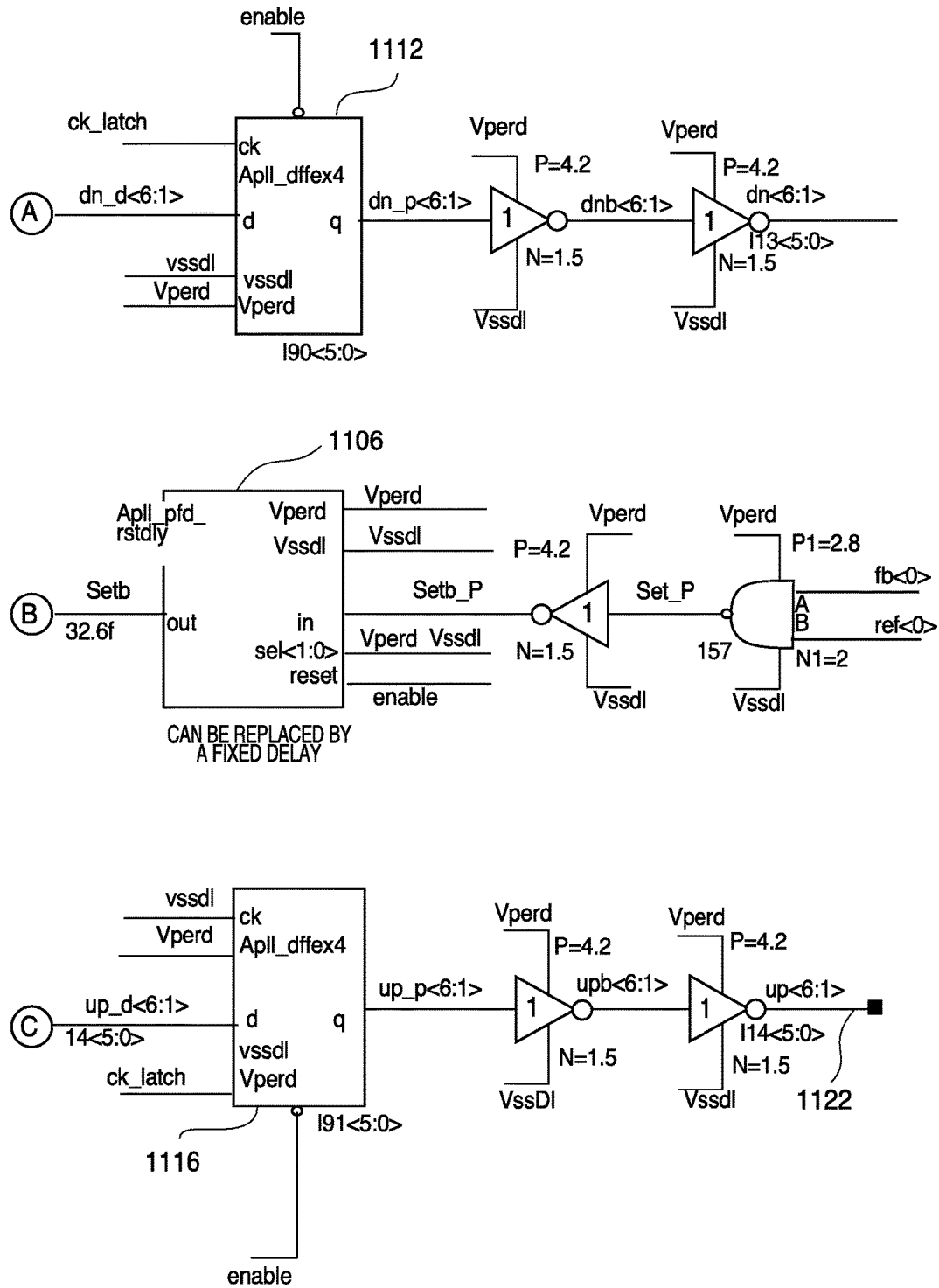
Figures 3, 10A:
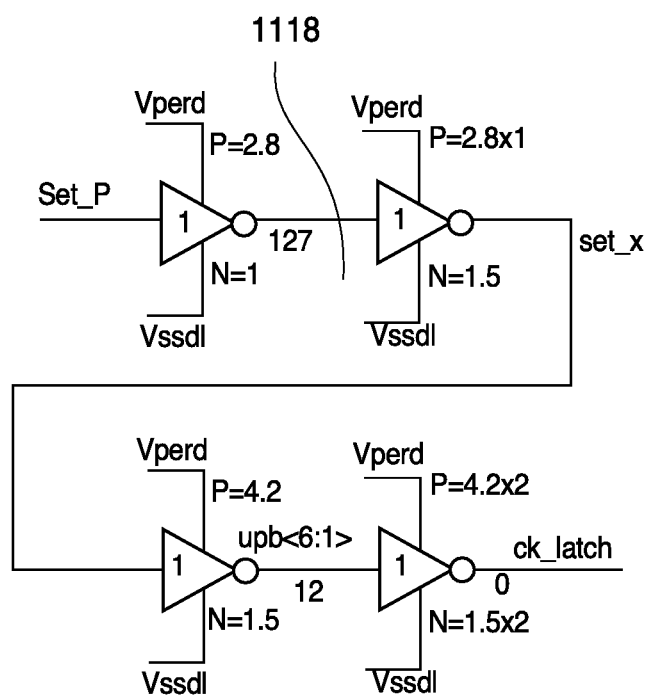
Figure 10B:
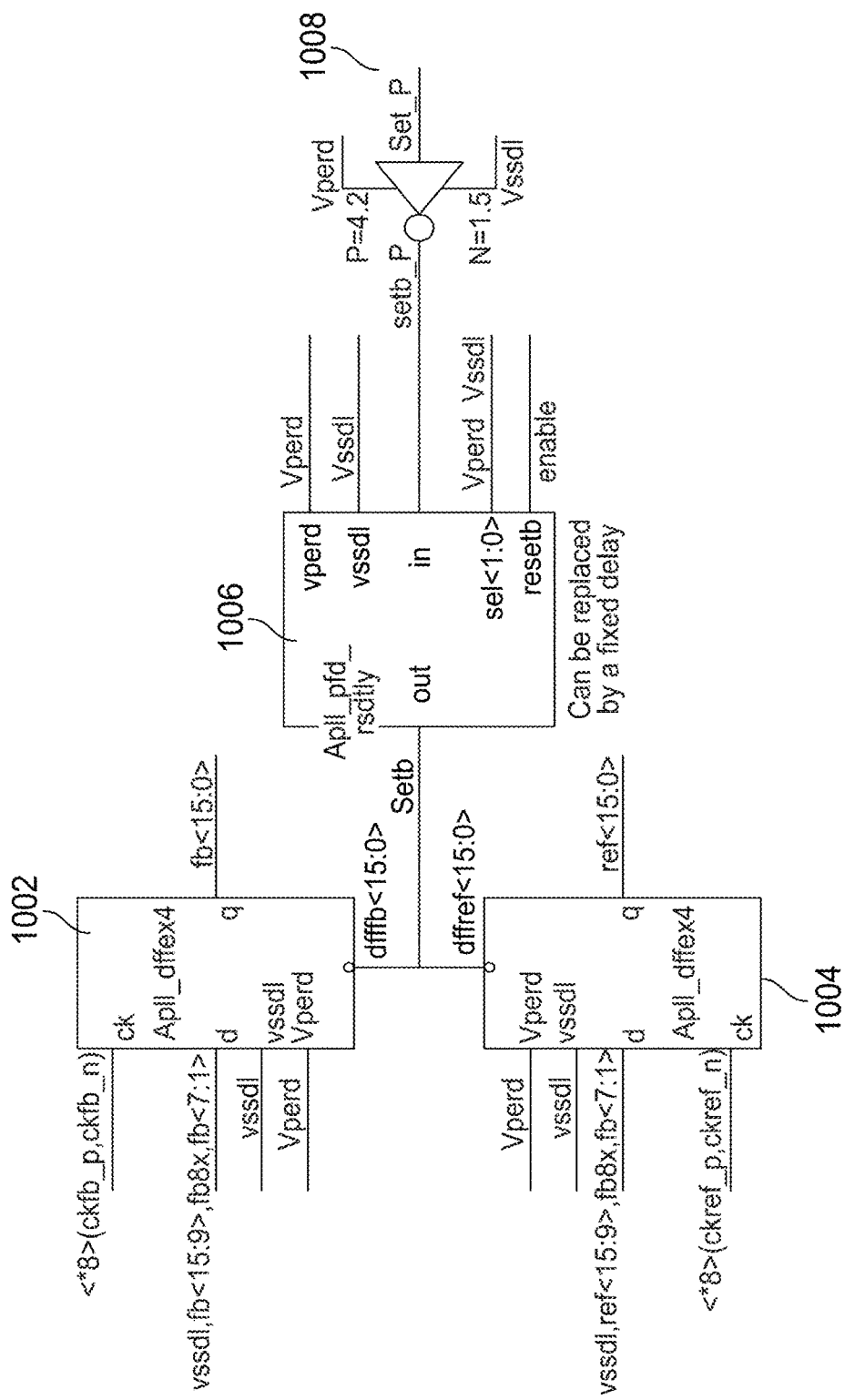
FIG. 10B illustrates a detailed diagram of exemplary circuit components and layout of certain frequency detector circuitry, consistent with aspects related to the innovations herein.

FIG. 10B illustrates a detailed diagram of exemplary circuit components of certain frequency detector circuitry, consistent with aspects related to the innovations herein. Referring to FIG. 10B, a detailed diagram of exemplary circuit components and layout includes the frequency detector register circuits 1002, 1004 and latch or delay circuitry 1006, consistent with aspects related to the innovations herein. Elements 1002 and 1004 are the shifter register chains for the feedback clock and reference clock, respectively. The output Setb of the delay circuit 1006 is then provided to an input of the shift register chain 1002 and 1004 shown in FIG. 10B. Here, it is noted that delay circuit 1006 may also be replaced by other suitable circuitry such as fixed delay circuitry. Element 1006 is the delay circuit for a "set" signal 1008. The output of element 1006 is input to element 914, set forth above. Element 914 is the logic for generating "latch" and "set" signals based on the output of element 1006.

FIGS. 10A-1 through 10A-3 show illustrative circuitry of exemplary frequency detector circuitry consistent with aspects of the innovations herein. These figures illustrate an implementation akin to FIGS. 9A-1 through 9A-3, though pertaining to one illustrative implementation FIG. 5B.

Figure 11A:
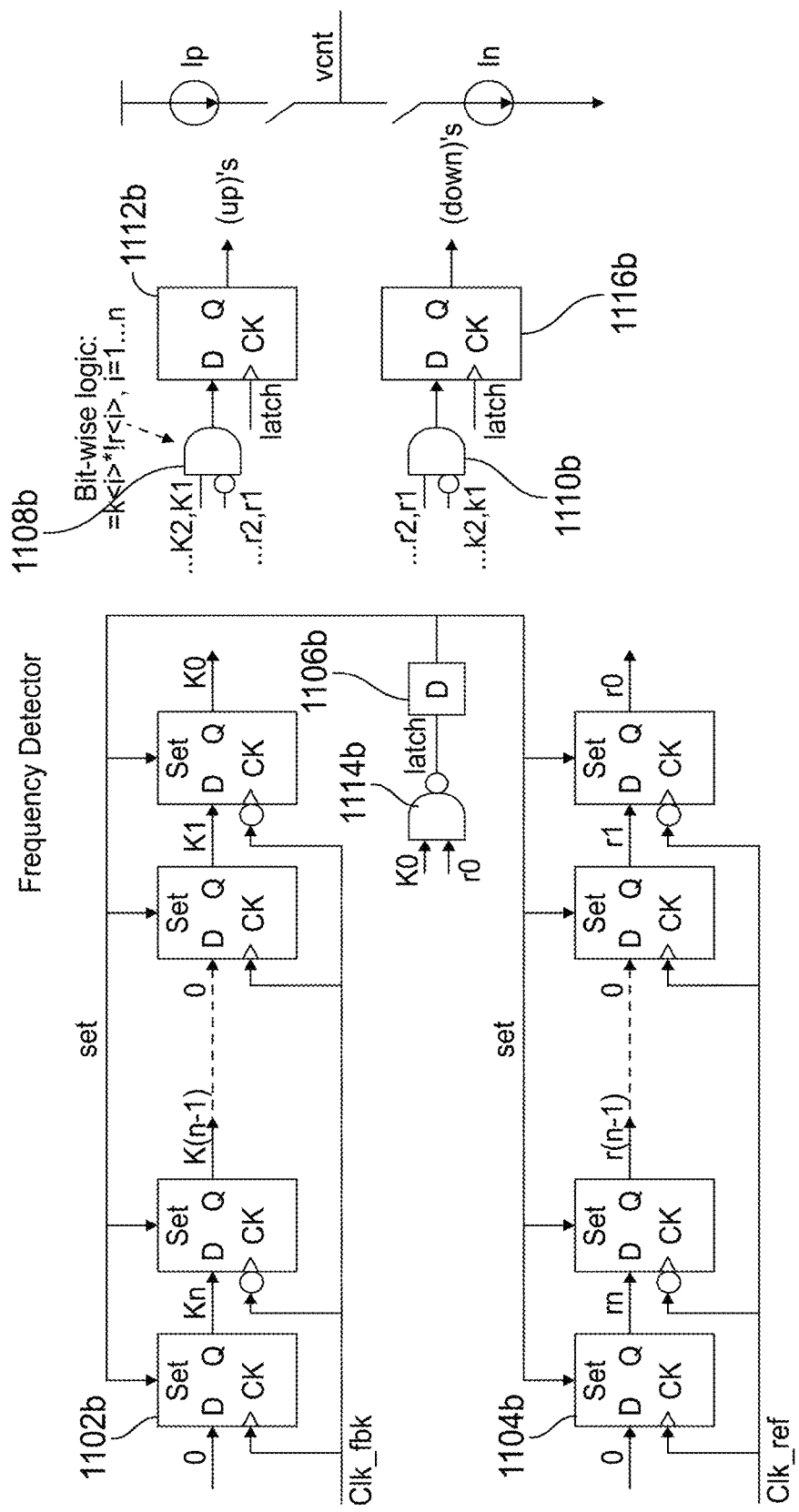
FIGS. 11A and 11B illustrates several elements of the exemplary frequency detector circuitry shown in previous drawings, consistent with aspects of the innovations herein.
Figure 11B:
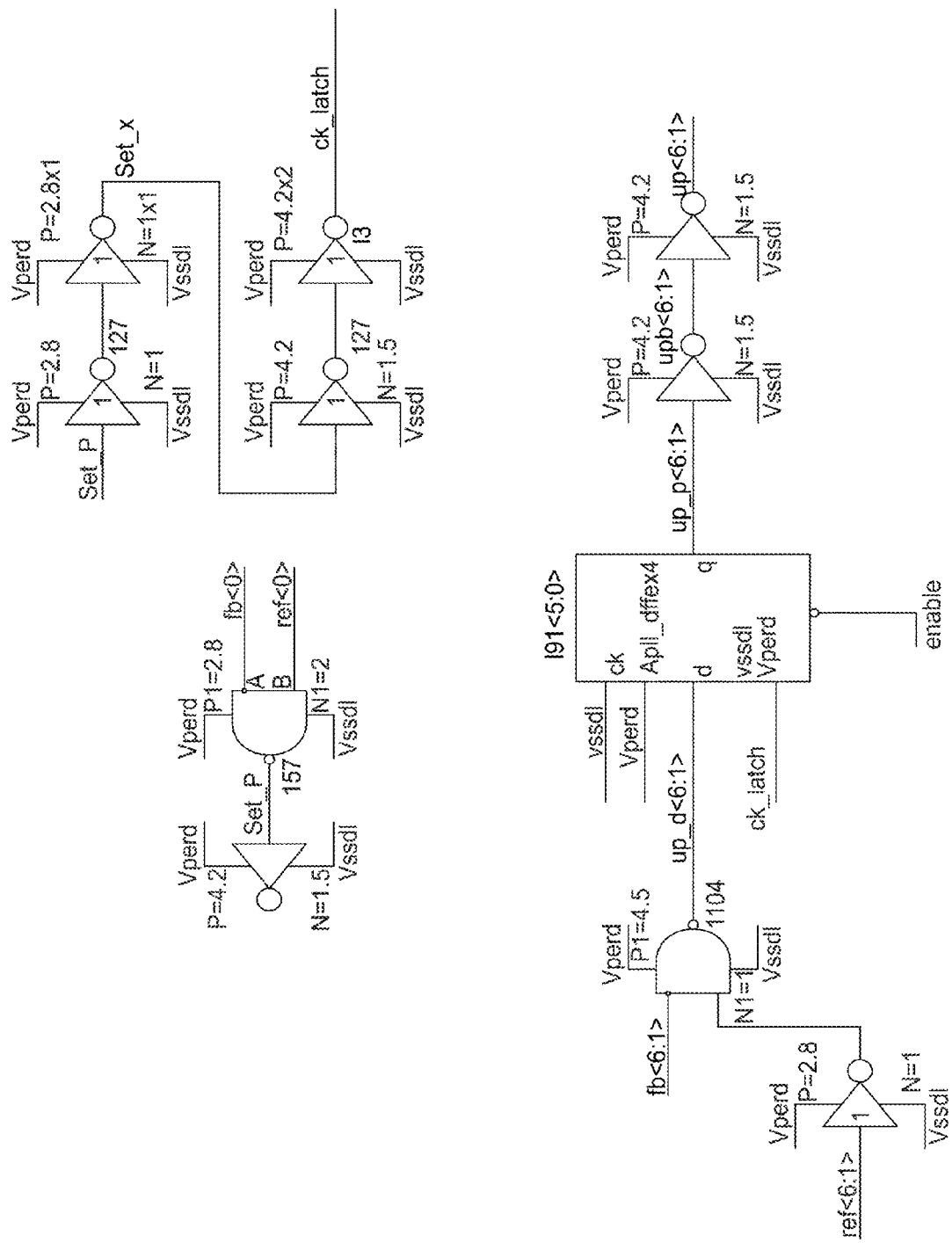

FIGS. 11A and 11B illustrate several elements of the exemplary frequency detector circuitry shown in previous drawings, consistent with aspects of the innovations herein. Referring to FIGS. 11A and 11B, several elements of FIGS. 9A-1 through 10B are illustrated and this drawing also helps serve to illustrate correspondence to earlier block diagrams, such as FIG. 5A. In these exemplary circuit illustrations, elements 1102b and 1104b are the shifter register chains for feedback clock and reference clock, respectively. Element 1114b is the logic for generating "latch" and "set" signals. Element 1106b is the delay circuit for "set" signal. Elements 1108b and 1110b are the bit-wise logic to compare the states of the two register chain. Elements 1112b and 1116b are latching the compared states from 1108b, 1110b logic, respectively. Elements 1120 and 1122 are the "up", "dn" signals for controlling charge pump circuit. Finally, element 1118 are buffers for the "latch" signal.

Figures 1, 12A:
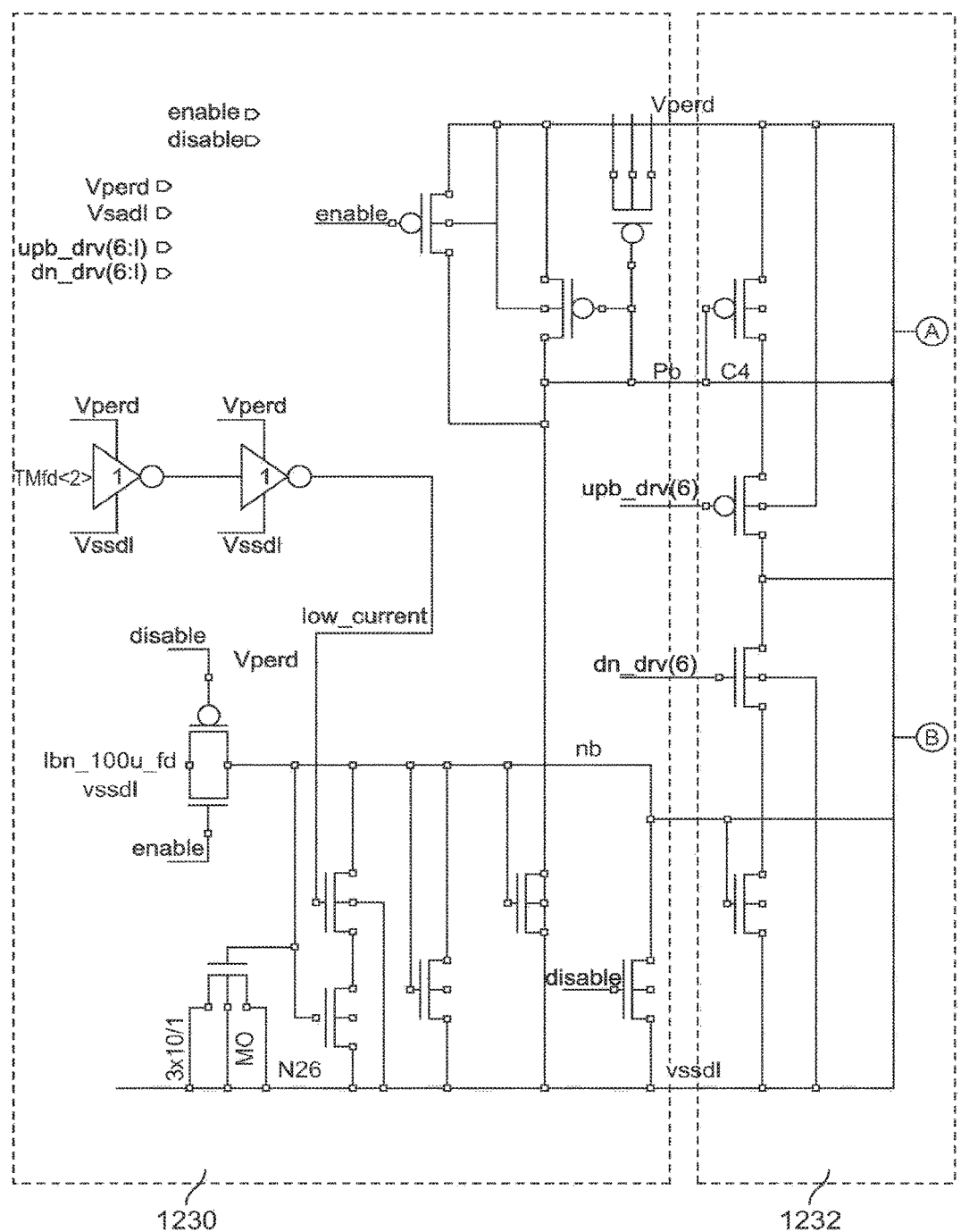
Figures 2, 12A:
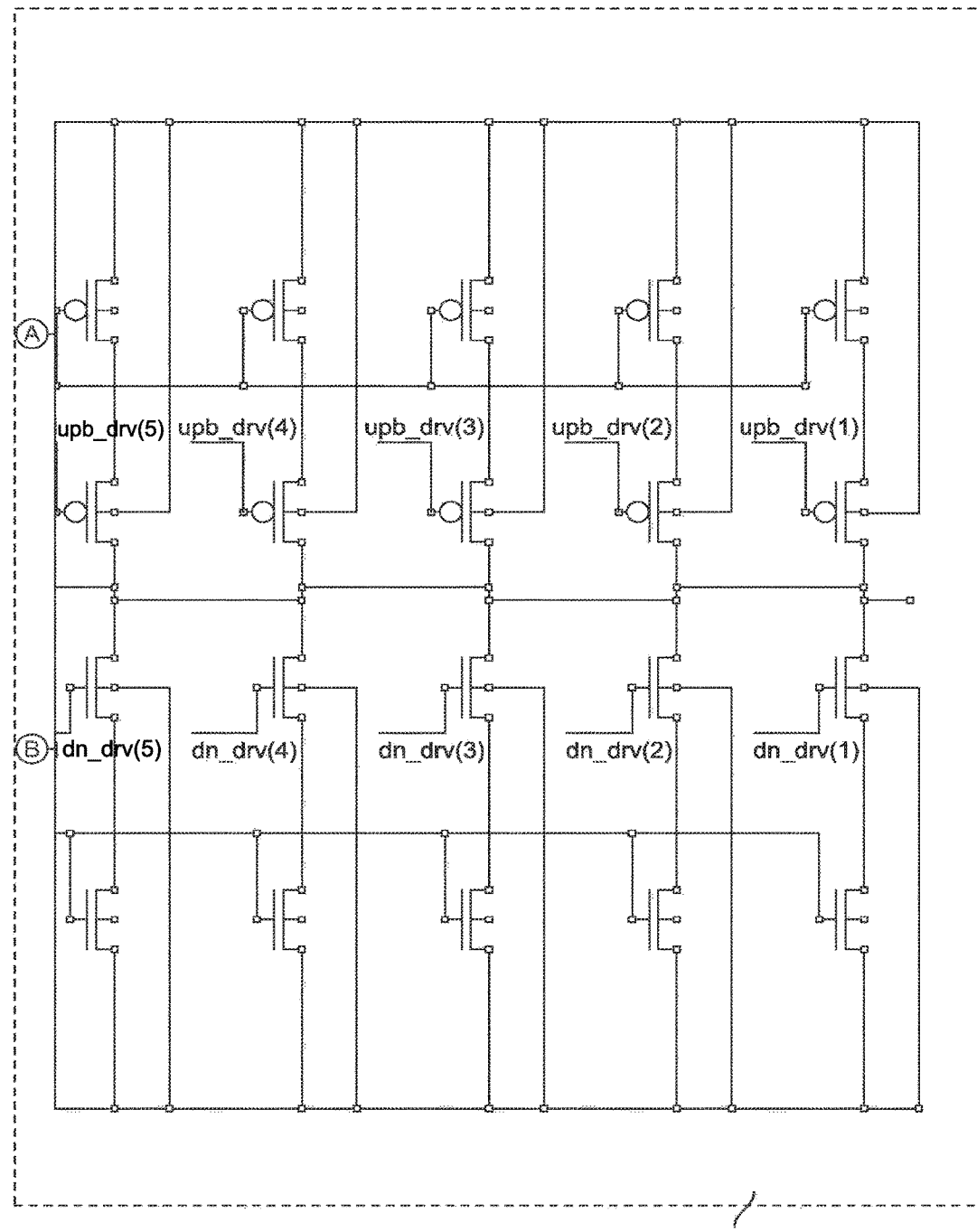
Figures 1, 12B:
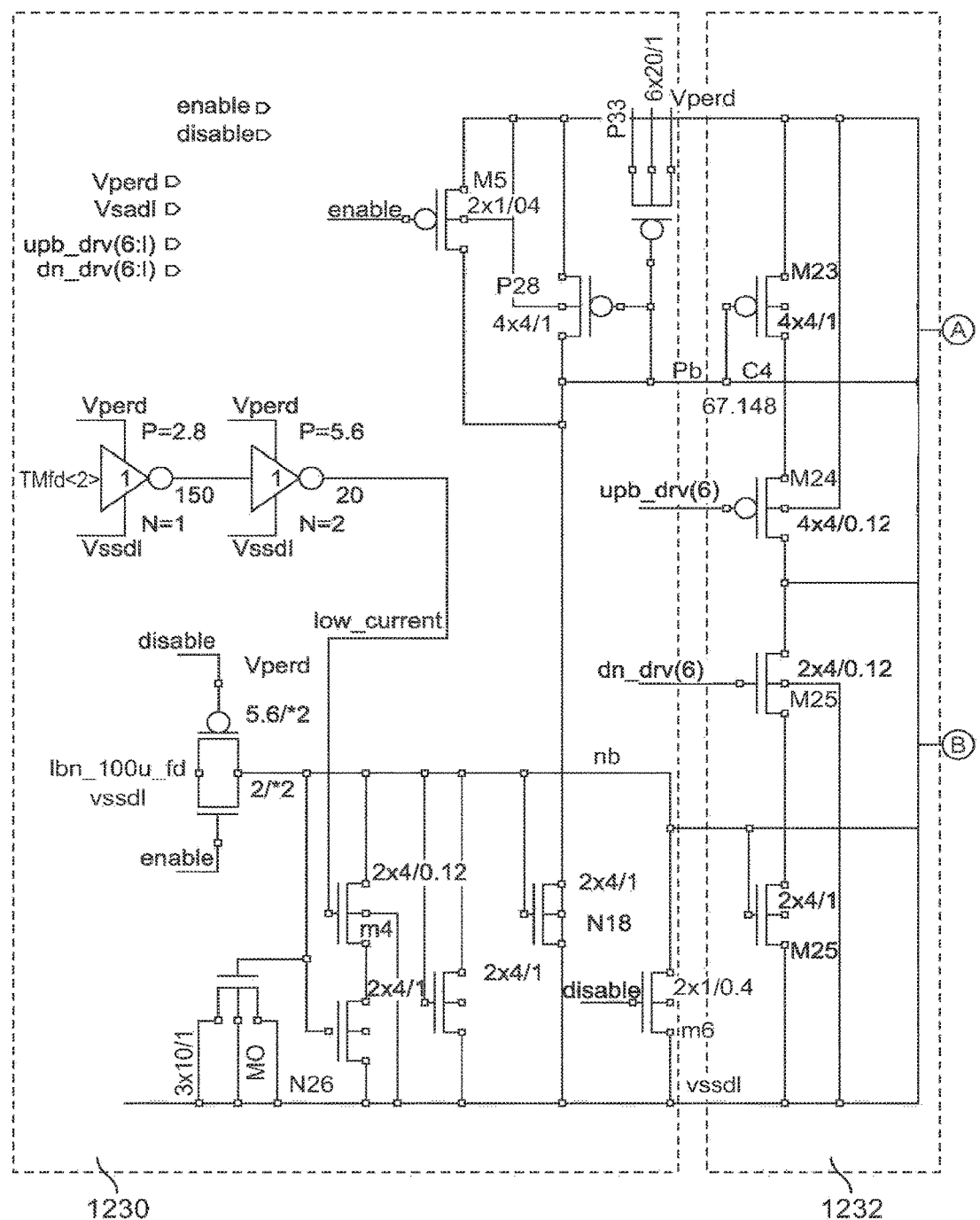
Figures 2, 12B:
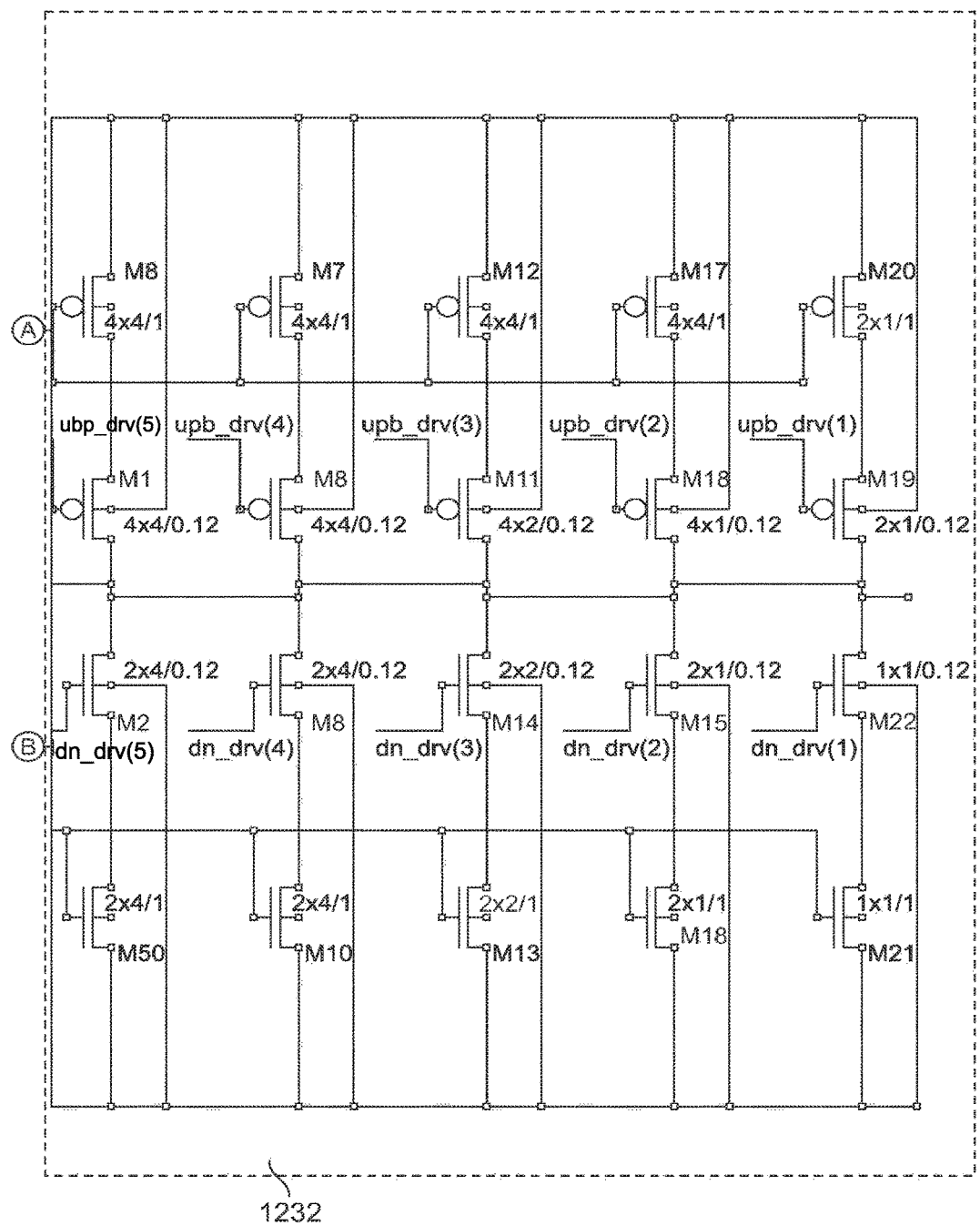
Figures 1, 12C:
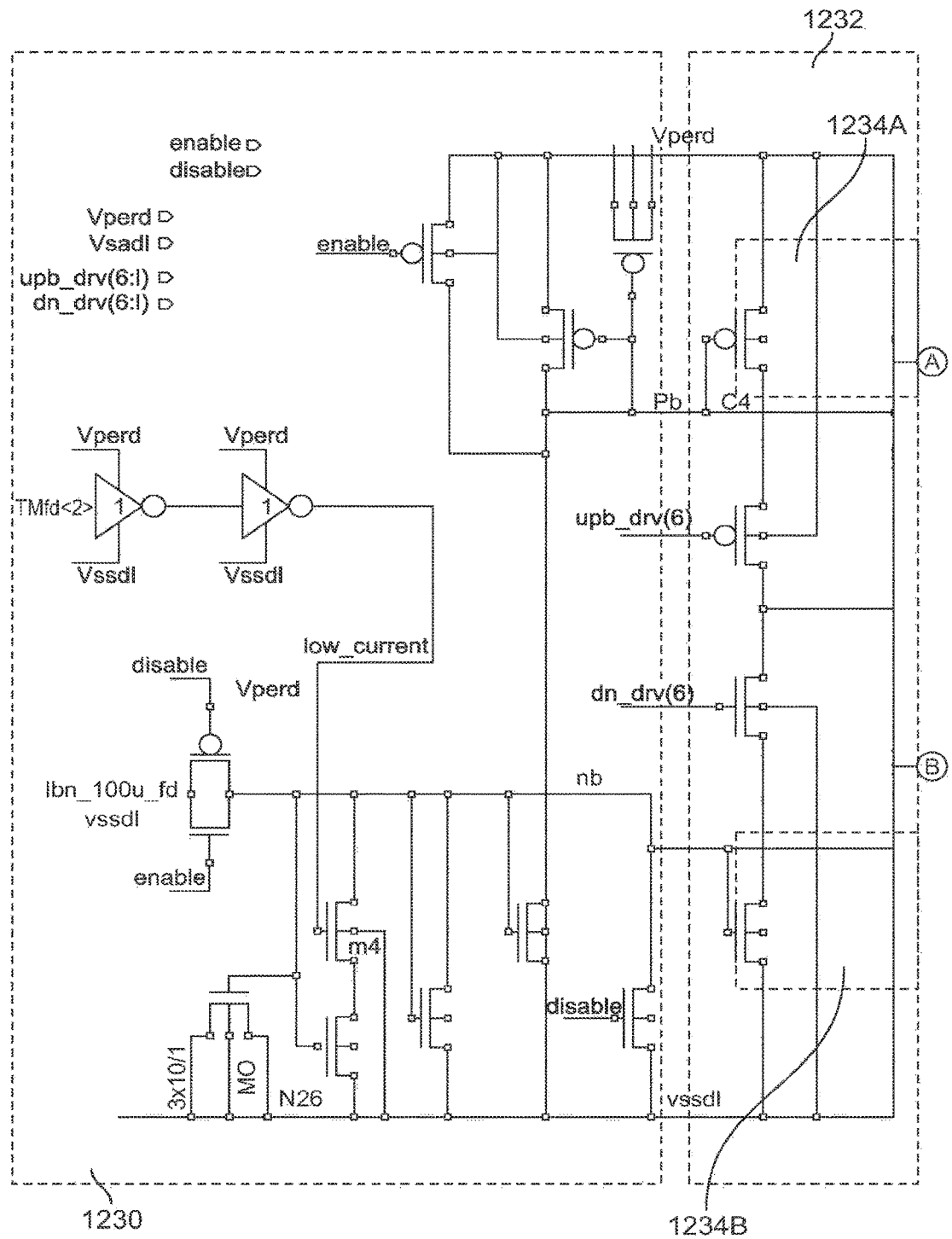
Figures 2, 12C:
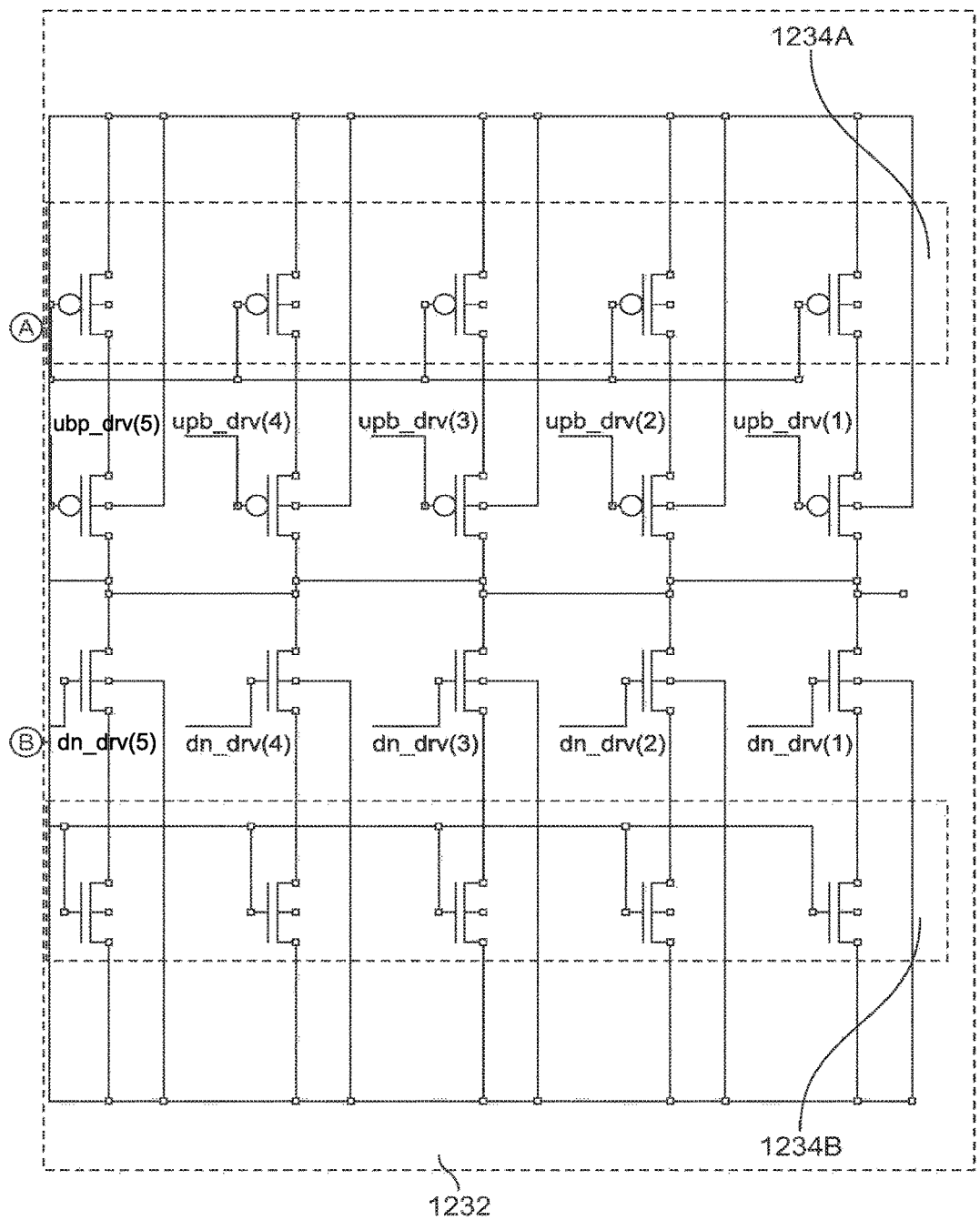

FIGS. 12A-1 through 12C-2 show illustrative circuitry of one exemplary second charge pump circuitry (e.g., charge pump circuitry 413) consistent with aspects of the innovations herein. Referring to FIGS. 12A-1 and 12A-2, a high-level drawing of exemplary circuitry is shown, illustrated with a biasing circuit 1230 on the input (left) side of the circuitry and various charging/discharging circuits within 1232. FIGS. 12B-1 and 12B-2 illustrate the transistors and circuit elements of FIG. 12A while further providing various illustrative device sizes/parameters for the exemplary circuit components shown. Referring to all of FIGS. 12A-1 through 12C-2, elements 1230 represent illustrative biasing circuitry, which may be configured, e.g., to generate constant current source or current sink for charging or discharging "vcnt". Further, element 1232 in FIGS. 12A-1 through 12C-2 illustrates exemplary circuitry branches of charging and discharging path controlled by the "up", "dn" signals from frequency detector. Moreover, in some implementations, the transfer curve may be controlled, set, or manipulated as a function of the components (e.g., varying the size, ratios, etc. thereof) shown in charging and discharging paths 1234A and 1234B in FIGS. 12C-1 and 12C-2. Here, for example, the curve may be adjusted to be non-linear at desired points of the transfer curve/function, such as when the frequency ration of the reference and feedback clocks are close to one.

Moreover, it is further noted that while some of FIGS. 9-12 show exemplary circuitry and component values that may be involved with the illustrative implementations depicted, different component and/or values may be utilized consistent with innovations herein.

As disclosed herein, features consistent with the present inventions may be implemented via computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations describe specific hardware components, systems and methods consistent with the innovations herein may be implemented with any combination of hardware, software and/or firmware. Moreover, the above-noted features and other aspects and principles of the innovations herein may be implemented in various environments. Such environments and related applications may be specially constructed for performing the various routines, processes and/or operations according to the invention or they may include a general-purpose computer or computing platform selectively activated or reconfigured by code to provide the necessary functionality. The processes disclosed herein are not inherently related to any particular computer, network, architecture, environment, or other apparatus, and may be implemented by a suitable combination of hardware, software, and/or firmware. For example, various general-purpose machines may be used with programs written in accordance with teachings of the invention, or it may be more convenient to construct a specialized apparatus or system to perform the required methods and techniques.

Aspects of the method and system described herein, such as the logic, may be implemented as functionality programmed into any of a variety of circuitry, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other possibilities for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, and/or as data and/or instructions embodied in various machine-readable or computer-readable media, in terms of their behavioral, register transfer, logic component, and/or other characteristics. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, and so on).

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

Although certain presently preferred implementations of the invention have been specifically described herein, it will be apparent to those skilled in the art to which the invention pertains that variations and modifications of the various implementations shown and described herein may be made without departing from the spirit and scope of the invention. Accordingly, it is intended that the invention be limited only to the extent required by the applicable rules of law.

The invention claimed is:

1. Phase lock loop (PLL) circuitry comprising:
voltage controlled oscillator (VCO) circuitry that generates a feedback clock signal;
phase frequency detector (PFD) circuitry that receives the feedback clock signal and a reference clock signal, compares phase of the feedback clock signal to phase of the reference clock signal, and outputs a phase comparison signal;
first charge pump circuitry that receives the phase comparison signal and outputs, to the VCO circuitry, a control signal proportional to the phase comparison signal;
frequency detector (FD) circuitry that receives the feedback clock signal and the reference clock signal, compares frequency of the feedback clock signal to frequency of the reference clock signal, and outputs a frequency difference signal that is proportional to frequency difference between frequencies of the feedback clock signal and the reference clock signal determined by the comparison;
second charge pump circuitry that receives the frequency difference signal and outputs, to the VCO circuit, a control signal proportional to the frequency difference signal;
wherein the FD circuitry comprises first shift register chain circuitry that receives the reference clock signal; second shift register chain circuitry that receives the feedback clock signal; and gate circuitry that generates a set signal based on an output of the first shift register chain circuit and/or an output of the second shift register chain circuit; and
wherein one or more of:
the first shift register chain circuitry is initialized to a logic 1 state and configured to shift in a logic 0 state when it receives the reference clock signal;
the second shift register chain circuitry is initialized to a logic 1 state and configured to shift in a logic 0 state when it receives the feedback clock signal;
the gate circuitry is configured to generate the set signal when a last stage output of the first shift register chain circuit is logic 0 and/or a last stage output of the second shift register chain circuit is logic 0;
the first shift register chain circuitry is reset to a logic 1 state after the set signal is generated; and/or
the second shift register chain circuitry is reset to a logic 1 state after the set signal is generated.

2. The PLL circuitry of claim 1, further comprising:
first divider circuitry that divides a primary reference clock signal to output the reference clock signal; and
second divider circuitry that divides a primary feedback clock signal to output the feedback clock signal.

3. The PLL circuitry of claim 1, further comprising low pass filter (LPF) circuitry that removes one or more high frequency components of the control signal output by the first charge pump circuitry and/or the control signal output by the second charge pump circuitry.

4. The circuitry of claim 3, wherein the LPF circuitry adjusts a loop stability characteristic of the PLL circuitry, adjusts a response time of the PLL circuitry, and/or adjusts a lock-in time of the PLL circuit.

5. The PLL circuitry of claim 1, wherein the set signal is an active high signal and/or wherein the register chains are initialized to state "1", and a state "0" shifts in with the reference clock and feedback clock.

6. The PLL circuitry of claim 1, wherein the reset signal is an active high signal and/or wherein the register chains are initialized to state "0", and a state "1" shifts in with the reference clock and feedback clock.

7. The PLL circuitry of claim 1, wherein:
the first shift register chain circuitry comprises a plurality of D flip-flops;
the second shift register chain circuitry comprises a plurality of D flip-flops; and
the gate circuitry comprises a NAND gate.

8. The PLL circuitry of claim 1, wherein the FD circuitry further comprises:
bit-wise logic operation and register circuitry that latches a state of the first shift register chain circuitry and a state of the second shift register chain circuitry.

9. The PLL circuitry of claim 8, wherein the bit-wise logic operation and register circuitry is configured to latch the state of the first shift register chain circuit and the state of the second shift register chain circuit with a bit-wise logic operation.

10. The PLL circuitry of claim 8, wherein the FD circuitry further comprises:
current generating circuitry comprising a switchable current source and a switchable current sink, the current generating circuit coupled to receive the latched state of the first shift register chain circuitry and the latched state of the second shift register chain circuitry and switch the current source and/or the current sink to generate the frequency difference signal.

11. The PLL circuitry of claim 1, wherein the FD circuitry further comprises:
bit-wise logic operation and register circuitry that latches a state of the first shift register chain circuitry and a state of the second shift register chain circuitry before the first shift register chain circuitry is reset to a logic 1 state after the set signal is generated and before the second shift register chain circuitry is reset to a logic 1 state.

12. The PLL circuitry of claim 11, wherein the bit-wise logic operation and register circuitry is configured to latch the state of the first shift register chain circuit and the state of the second shift register chain circuit with a bit-wise logic operation.

13. The PLL circuitry of claim 11, wherein the FD circuitry further comprises:
current generating circuitry comprising a switchable current source and a switchable current sink, the current generating circuitry coupled to receive the latched state of the first shift register chain circuitry and the latched state of the second shift register chain circuitry and switch the current source and/or the current sink to generate the frequency difference signal.

14. The PLL circuitry of claim 1, wherein one or more of:
the first shift register chain circuitry is initialized to a logic 0 state and configured to shift in a logic 1 state when it receives the reference clock signal;
the second shift register chain circuitry is initialized to a logic 0 state and configured to shift in a logic 1 state when it receives the feedback clock signal;
the gate circuitry is configured to generate the set signal when a last stage output of the first shift register chain circuit is logic 1 and/or a last stage output of the second shift register chain circuit is logic 1;
the first shift register chain circuitry is reset to a logic 0 state after the set signal is generated; and
the second shift register chain circuitry is reset to a logic 0 state after the set signal is generated.

15. The PLL circuitry of claim 14, wherein the FD circuitry further comprises:
bit-wise logic operation and register circuitry that latches a state of the first shift register chain circuitry and a state of the second shift register chain circuitry before the first shift register chain circuitry is reset to a logic 0 state after the set signal is generated and before the second shift register chain circuitry is reset to a logic 0 state.

16. The PLL circuitry of claim 15, or any Hnim hnmin wherein the bit-wise logic operation and register circuit latches the state of the first shift register chain circuitry and the state of the second shift register chain circuitry with a bit-wise logic operation.

17. The PLL circuitry of claim 15, wherein the FD circuitry further comprises:
current generating circuitry comprising a switchable current source and a switchable current sink, the current generating circuitry coupled to receive the latched state of the first shift register chain circuit and the latched state of the second shift register chain circuit and switch the current source and/or the current sink to generate the frequency difference signal.

18. Phase lock loop (PLL) circuitry comprising:
voltage controlled oscillator (VCO) circuitry that generates a feedback clock signal;
phase frequency detector (PFD) circuitry that receives the feedback clock signal and a reference clock signal, compares phase of the feedback clock signal to phase of the reference clock signal, and outputs a phase comparison signal;
frequency detector (FD) circuitry that receives the feedback clock signal and the reference clock signal, compares frequency of the feedback clock signal to frequency of the reference clock signal, and outputs a frequency difference signal that is proportional to frequency difference between frequencies of the feedback clock signal and the reference clock signal determined by the comparison, wherein the frequency detector circuitry comprises:
first shift register chain circuitry that receives the reference clock signal;

second shift register chain circuitry that receives the feedback clock signal; and gate circuitry that generates a set signal based on an output of the first shift register chain circuit and/or an output of the second shift register chain circuitry;

converting circuitry that receives the phase comparison signal and/or the frequency difference signal and outputs, to the VCO circuitry, a control signal proportional to the phase comparison signal and/or the frequency difference signal; and wherein one or more of:

the first shift register chain circuit is initialized to a logic 1 state and configured to shift in a logic 0 state when it receives the reference clock signal;

the second shift register chain circuit is initialized to a logic 1 state and configured to shift in a logic 0 state when it receives the feedback clock signal;

the gate circuit is configured to generate the set signal when a last stage output of the first shift register chain circuit is logic 0 and/or a last stage output of the second shift register chain circuit is logic 0;

the first shift register chain circuit is reset to a logic 1 state after the set signal is generated; and/or the second shift register chain circuit is reset to a logic 1 state after the set signal is generated.

19. The circuitry of claim 18, wherein the converting circuitry include charge pump circuitry.

20. The circuitry of claim 18, further comprising one or more of:

bit-wise logic operation and register circuitry configured to latch a state of the first shift register chain circuit and a state of the second shift register chain circuit with a bit-wise logic operation; and/or a current generating circuit comprising a switchable current source and a switchable current sink, the current generating circuit being configured to receive the latched state of the first shift register chain circuit and the latched state of the second shift register chain circuit and switch the current source and/or the current sink to generate the frequency difference signal;

first divider circuitry configured to divide a primary reference clock signal to output the reference clock signal;

second divider circuitry configured to divide a primary feedback clock signal to output the feedback clock signal; and/or LPF circuitry configured to remove one or more high frequency components of the control signal output by the first charge pump and/or the control signal output by the second charge pump, to adjust a loop stability characteristic of the PLL circuit, to adjust a response time of the PLL circuit, and/or to adjust a lock-in time of the PLL circuit.

21. The PLL circuitry of claim 20, wherein the bit-wise logic operation and register circuitry is configured to latch a state of the first shift register chain circuit and a state of the second shift register chain circuit before the first shift register chain circuit is reset to a logic 0 state after the set signal is generated and before the second shift register chain circuit is reset to a logic 0 state.

22. The PLL circuitry of claim 19, wherein one or more of:

the first shift register chain circuitry is initialized to a logic 0 state and configured to shift in a logic 1 state when it receives the reference clock signal;

the second shift register chain circuitry is initialized to a logic 0 state and configured to shift in a logic 1 state when it receives the feedback clock signal;

the gate circuitry is configured to generate the set signal when a last stage output of the first shift register chain circuit is logic 1 and/or a last stage output of the second shift register chain circuit is logic 1;

the first shift register chain circuitry is reset to a logic 0 state after the set signal is generated; and/or the second shift register chain circuitry is reset to a logic 0 state after the set signal is generated.

23. The PLL circuitry of claim 21, wherein the bit-wise logic operation and register circuit is configured to latch a state of the first shift register chain circuit and a state of the second shift register chain circuit before the first shift register chain circuit is reset to a logic 1 state after the set signal is generated and before the second shift register chain circuit is reset to a logic 1 state.

* * * * *